United States Patent
Matsuzaki et al.

(10) Patent No.: US 8,542,073 B2
(45) Date of Patent: Sep. 24, 2013

(54) VARIABLE-CAPACITANCE DEVICE

(75) Inventors: Tomokazu Matsuzaki, Kanagawa (JP); Kazutoshi Sako, Kanagawa (JP)

(73) Assignee: Renesas Electronics Corportion, Kawasaka-shi, Kanagawa (JP)

( * ) Notice: Subject to any disclaimer, the term of this patent is extended or adjusted under 35 U.S.C. 154(b) by 90 days.

(21) Appl. No.: 13/067,328

(22) Filed: May 25, 2011

(65) Prior Publication Data

US 2011/0309889 A1 Dec. 22, 2011

(30) Foreign Application Priority Data

Jun. 22, 2010 (JP) ................................. 2010-141487

(51) Int. Cl.
*H03K 3/26* (2006.01)

(52) U.S. Cl.
USPC ............ 331/111; 331/36 C; 331/57; 331/143; 331/177 V; 327/182; 327/183; 327/337; 327/581

(58) Field of Classification Search
USPC .............. 331/36 C, 57, 111, 177 V; 327/182, 327/183, 337, 581
See application file for complete search history.

(56) References Cited

U.S. PATENT DOCUMENTS

| 5,594,388 | A | 1/1997 | O'Shaughnessy et al. | |
|---|---|---|---|---|
| 6,058,294 | A * | 5/2000 | Bruwer et al. | 455/119 |
| 6,815,996 | B1 * | 11/2004 | Hsiao | 327/337 |
| 7,068,116 | B2 * | 6/2006 | Kato et al. | 331/111 |
| 2008/0238560 | A1 | 10/2008 | Shibata | |
| 2009/0033434 | A1 * | 2/2009 | Ikeda et al. | 331/36 |
| 2010/0019826 | A1 * | 1/2010 | Yeh | 327/337 |

FOREIGN PATENT DOCUMENTS

JP 2008-252774 A 10/2008

* cited by examiner

*Primary Examiner* — Arnold Kinkead
*Assistant Examiner* — Richard Tan
(74) *Attorney, Agent, or Firm* — McGinn IP Law Group, PLLC

(57) ABSTRACT

A variable-capacitance device includes a first capacitance element coupled between a first power supply terminal and an output terminal, a capacitance selection switch that is turned on and off in accordance with a capacitance switching signal, a second capacitance element coupled in parallel to the first capacitance element and in series to the capacitance selection switch, and an error correction circuit configured to operate such that in a state in which the capacitance selection switch is in an OFF state, in response to a charge reset signal that causes a voltage at the output terminal to be reset to a reset voltage, the error correction circuit substantially eliminates a difference between the voltage at the output terminal and a voltage at a capacitance switching node at which the second capacitance element is coupled to the capacitance selection switch.

8 Claims, 16 Drawing Sheets

US 8,542,073 B2

VARIABLE-CAPACITANCE DEVICE

CROSS-REFERENCE TO RELATED APPLICATIONS

The disclosure of Japanese Patent Application No. 2010-141487 filed on Jun. 22, 2010 including the specification, drawings and abstract is incorporated herein by reference in its entirety.

BACKGROUND

The present invention relates to a variable-capacitance device, and more particularly, to a variable-capacitance device whose capacitance is switched by switching the number of capacitors coupled in parallel.

A circuit formed in a semiconductor device may include a capacitance element. However, in such a semiconductor device, it is difficult to change the capacitance of the capacitance element after production of a semiconductor chip is complete. To solve the problem described above, it is known to use a variable-capacitance device whose capacitance can be changed after the production of the semiconductor chip is complete. The variable-capacitance device is an element whose capacitance can be switched or changed, for example, in accordance with a control signal. Examples of variable-capacitance devices may be found, for example, in U.S. Pat. No. 5,594,388, and Japanese Patent Laid-Open No. 2008-252774.

FIG. 17 illustrates a circuit diagram of a variable-capacitance device 100 equivalent to a variable-capacitance device disclosed in U.S. Pat. No. 5,594,388. As shown in FIG. 17, the variable-capacitance device 100 includes capacitors C1 and C2 and a capacitance selection switch 101. The variable-capacitance device 100 also includes an output terminal COUT at one end of the variable-capacitance device 100. The other end of the variable-capacitance device 100 is supplied with a ground voltage VSS.

The capacitor C1 is coupled between the output terminal COUT and a ground terminal to which the ground voltage VSS is supplied. The capacitor C2 is provided such that the capacitor C2 is coupled in parallel to the capacitor C1 and coupled in series to the capacitance selection switch 101. More specifically, one end of the capacitor C2 is coupled to the ground terminal, and the other end is coupled to one terminal of the capacitance selection switch 101. Hereafter, a node at which the capacitance selection switch 101 and the capacitor C2 are coupled is denoted by ND1. The other terminal of the capacitance selection switch 101 is coupled to the output terminal COUT. The capacitance selection switch 101 is configured in the form of a transfer switch. The capacitance selection switch 101 includes an NMOS transistor N101, a PMOS transistor P101, and an inverter INV101. The source of the NMOS transistor N101 and the source of the PMOS transistor P101 are coupled together. The drain of the NMOS transistor N101 and the drain of the PMOS transistor P101 are coupled together. A capacitance switching signal CSEL is input to the gate of the NMOS transistor N101. The capacitance switching signal CSEL is input to the gate of the PMOS transistor P101 via the inverter INV101. The capacitance selection switch 101 is in an ON state when the capacitance switching signal CSEL is in an enable state (more specifically, for example, when it is at a high level), while the capacitance selection switch 101 is in an OFF state when the capacitance switching signal CSEL is in a disable state (more specifically, for example, when it is at a low level).

When the capacitance selection switch 101 is in the ON state, the variable-capacitance device 100 has capacitance equal to the sum of the capacitance of the capacitor C1 and the capacitance of the capacitor C2. On the other hand, when the capacitance selection switch 101 is in the OFF state, the variable-capacitance device 100 has capacitance equal to the capacitance of the capacitor C1.

FIG. 18 is a circuit diagram of a variable-capacitance device 200 equivalent to a variable-capacitance device disclosed in Japanese Patent Laid-Open No. 2008-252774. As shown in FIG. 18, the variable-capacitance device 200 includes capacitors C1 and C2 and a switch circuit (more specifically, an NMOS transistor N201 in the example shown in FIG. 18). The variable-capacitance device 200 has an output terminal COUT at one end of the variable-capacitance device 200. A ground voltage VSS is supplied to the other end of the variable-capacitance device 200.

The capacitor C1 is coupled between the output terminal COUT and a ground terminal to which the ground voltage VSS is supplied. The capacitor C2 is provided such that the capacitor C2 is coupled in parallel to the capacitor C1 and coupled in series to the NMOS transistor N201. The source of the NMOS transistor N201 is coupled to the ground terminal, and the drain of the NMOS transistor N201 is coupled to one end of the capacitor C2. Hereinafter, a node at which the drain of the NMOS transistor N201 and the capacitor C2 are coupled together is denoted by ND2. The other end of the capacitor C2 is coupled to the output terminal COUT. A capacitance switching signal CSEL is input to the gate of the NMOS transistor N201. The NMOS transistor N201 is in an ON state when the capacitance switching signal CSEL is in an enable state (more specifically, for example, when it is at a high level), while NMOS transistor N201 is in an OFF state when the capacitance switching signal CSEL is in a disable state (more specifically, for example, when it is at a low level).

When the NMOS transistor N201 is in the ON state, the variable-capacitance device 200 has capacitance equal to the sum of the capacitance of the capacitor C1 and the capacitance of the capacitor C2. On the other hand, when the NMOS transistor N201 is in the OFF state, variable-capacitance device 200 has capacitance equal to the capacitance of the capacitor C1.

SUMMARY

The variable-capacitance device 100 and the variable-capacitance device 200 have a problem that high accuracy is not achieved in capacitance. In the case of the variable capacitance device 100, when there is a voltage difference between the node ND1 and the output terminal COUT, a leakage current Ileak can flow through the capacitance selection switch 101. In the case of the variable-capacitance device 200, when there is a voltage difference between the node ND2 and the ground voltage VSS, a leakage current Ileak can flow through the NMOS transistor N201. The leakage current Ileak occurs when the switch circuit is in the OFF state. When the switch circuit is in the OFF state, if the capacitor C1 is charged or discharged, the charging or discharging current is affected by the leakage current Ileak. The leakage current Ileak can have an effect equivalent to an effect of a change in the capacitance of the capacitor C1. Another problem is that the capacitance continues to change until the leakage current Ileak settles to a particular value.

Furthermore, in the variable-capacitance device 100, the capacitance selection switch 101 is disposed between the output terminal COUT and the capacitor C2. The capacitance selection switch 101 is realized by transistors. In general, a transistor has parasitic capacitance between its gate and source and also between its gate and drain. The parasitic capacitance changes in magnitude depending on the difference between the voltage of the output terminal COUT and the voltage of the node ND1. This means that the parasitic capacitance of the capacitance selection switch 101 can cause a deviation to occur in the capacitance of the variable-capacitance device 100.

According to an aspect of the present invention, a variable-capacitance device includes a first capacitance element coupled between a first power supply terminal and an output terminal, a capacitance selection switch configured to turn on or off in accordance with a capacitance switching signal, a second capacitance element coupled in parallel to the first capacitance element and in series to the capacitance selection switch, and an error correction circuit configured to operate such that in a state in which the capacitance selection switch is in an OFF state, in response to a charge reset signal that causes a voltage at the output terminal to be reset to a reset voltage, the error correction circuit substantially eliminates a difference between the voltage at the output terminal and a voltage at a capacitance switching node at which the second capacitance element is coupled to the capacitance selection switch.

In the variable-capacitance device according to the aspect of the invention, the charge stored in the first capacitance element is reset by the reset voltage before the charging/discharging of the first capacitance element is performed. In this process, in the variable-capacitance device according to the aspect of the invention, the voltage at the capacitance switching node at which the second capacitance element is coupled to the capacitance selection switch is set to be substantially equal to the voltage at the output terminal. Thus, in the variable-capacitance device according to the aspect of the invention, when the charging/discharging of the first capacitance element is performed in a state in which the second capacitance element is not selected, an effect of a leakage current Ileak flowing through the capacitance selection switch is eliminated thereby preventing the capacitance of the first capacitance element from being deviated.

The aspect of the present invention allows an increase in accuracy of the capacitance of the variable-capacitance device.

BRIEF DESCRIPTION OF THE DRAWINGS

FIG. 11 is a timing chart illustrating an operation of the oscillation circuit shown in

FIG. 7;

DETAILED DESCRIPTION

First Embodiment

Figure 1:
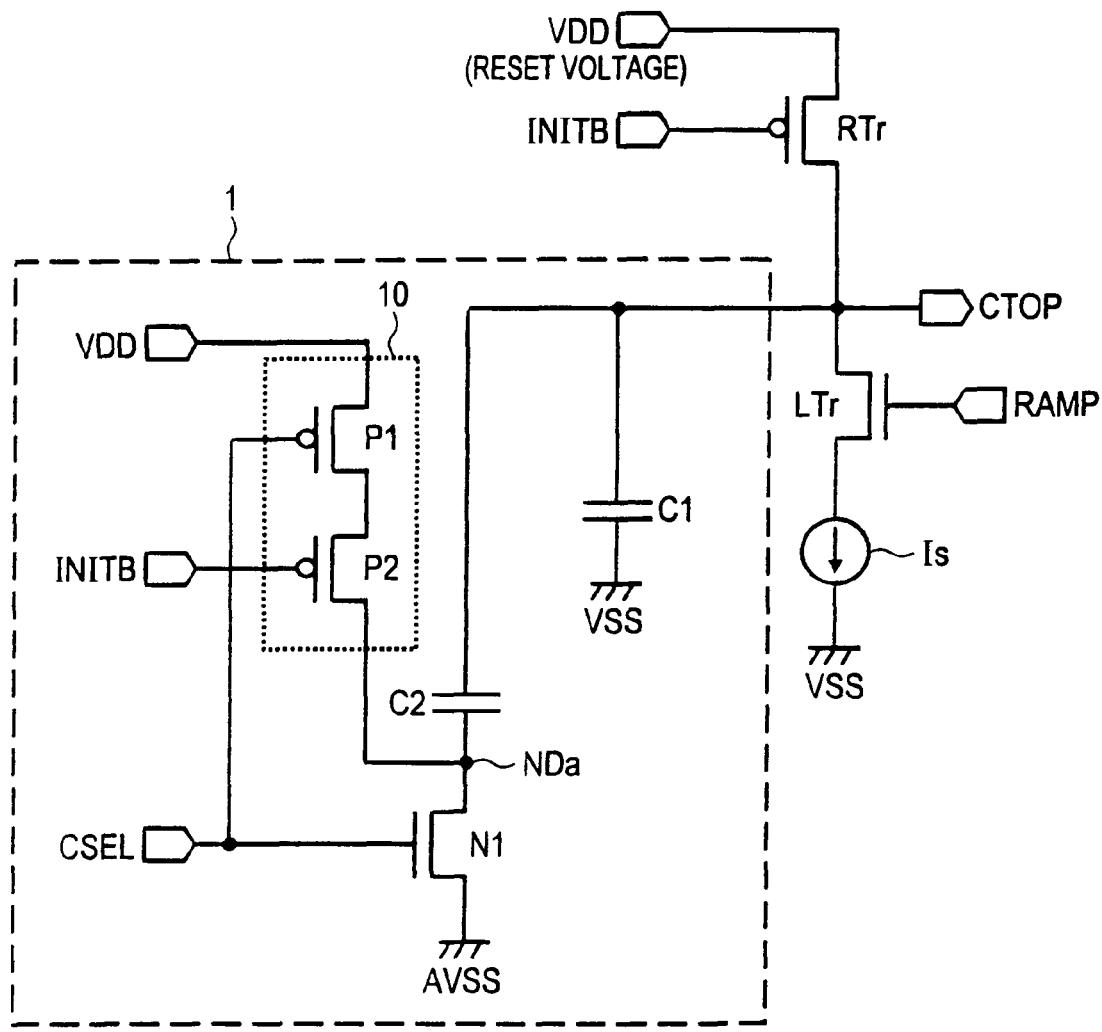
FIG. 1 is a circuit diagram of a variable-capacitance device according to a first embodiment of the invention.

Embodiments of the present invention are described below with reference to the accompanying drawings. FIG. 1 is a circuit diagram of a variable-capacitance device 1 according to a first embodiment. Note that in FIG. 1, a charging/discharging circuit configured to charge and discharge the variable-capacitance device 1 is also shown as a peripheral circuit of the variable-capacitance device 1. In the example shown in FIG. 1, the peripheral circuit includes a reset transistor RTr, a charge/discharge control transistor LTr, and a current source Is. Note that in the following description the symbol "Is" is used to describe both the current source and a current output by the current source.

As shown in FIG. 1, the variable-capacitance device 1 includes a first capacitance element (a capacitor C1 in the present example), a second capacitance element (a capacitor C2 in the present example), a capacitance selection switch (an NMOS transistor N1 in the present example), and an error correction circuit 10.

The capacitor C1 is coupled between a first power supply terminal (a ground terminal via which a ground voltage VSS is supplied, in the present example) and an output terminal CTOP. The capacitor C2 is coupled in parallel to the capacitor C1 and also coupled in series to the NMOS transistor N1. The NMOS transistor N1 is turned on and off in accordance with a capacitance switching signal CSEL. The NMOS transistor N1 is coupled such that a source thereof is coupled to the ground terminal, a drain thereof is coupled to the capacitor C2, and the capacitance switching signal CSEL is input to the gate thereof. A first terminal of the capacitor C2 is coupled to the output terminal CTOP and a second terminal of the capacitor C2 is coupled to the drain of the NMOS transistor N1. In the following description, a node at which the capacitor C1 and the NMOS transistor N1 are coupled together is denoted by a capacitance switching node NDa.

When the NMOS transistor N1 is in the OFF state, the error correction circuit 10 sets the capacitance switching node NDa so as to have substantially the same voltage as the voltage of the output terminal CTOP in response to the charge reset signal INITB that causes the output terminal CTOP to be reset to the reset voltage. The error correction circuit 10 includes PMOS transistors P1 and P2. A power supply voltage VDD is supplied to the source of the PMOS transistor P1, and the capacitance switching signal CSEL is input to the gate of the PMOS transistor P1. The drain of the PMOS transistor P1 is coupled to the source of the PMOS transistor P2. The charge reset signal INITB is input to the gate of the PMOS transistor P2. The drain of the PMOS transistor P2 is coupled to the capacitance switching node NDa.

Next, a peripheral circuit is described. In FIG. 1, the peripheral circuit includes the reset transistor RTr, the charge/discharge control transistor LTr, and the current source Is. The reset transistor RTr is realized using a PMOS transistor. The reset transistor RTr is coupled such that the power supply voltage VDD (more specifically, the reset voltage) is supplied to the source, the charge reset signal INITB is input to the gate, and the drain is coupled to the output terminal CTOP. When the charge reset signal INITB is in the enable state (the low-level state in the present example), the reset transistor RTr supplies the reset voltage to the output terminal CTOP. When the charge reset signal INITB is in the disable state (the high-level state in the present example), the reset transistor RTr stops supplying the reset voltage to the output terminal CTOP.

The charge/discharge control transistor LTr is realized by an NMOS transistor. The drain of the charge/discharge control transistor LTr is coupled to the output terminal CTOP. A ramp control signal RAMP is input to the gate of the charge/discharge control transistor LTr. The source of the charge/discharge control transistor LTr is coupled to one terminal of the current source Is. The current source Is draws a current Is from the output terminal CTOP. The other terminal of the current source Is is coupled to the ground terminal. When the ramp control signal RAMP is in the enable state (more specifically, the high-level state in the present example), the charge/discharge control transistor LTr turns on. As a result, the current source Is is coupled to the output terminal CTOP. When the ramp control signal RAMP is in the disable state (more specifically, the low-level state in the present example), the charge/discharge control transistor LTr turns off and thus the current source Is is decoupled from the output terminal CTOP.

In the present embodiment, the charge reset signal INITB and the ramp control signal RAMP are output by a control circuit that is not shown in the figure.

Figure 2:
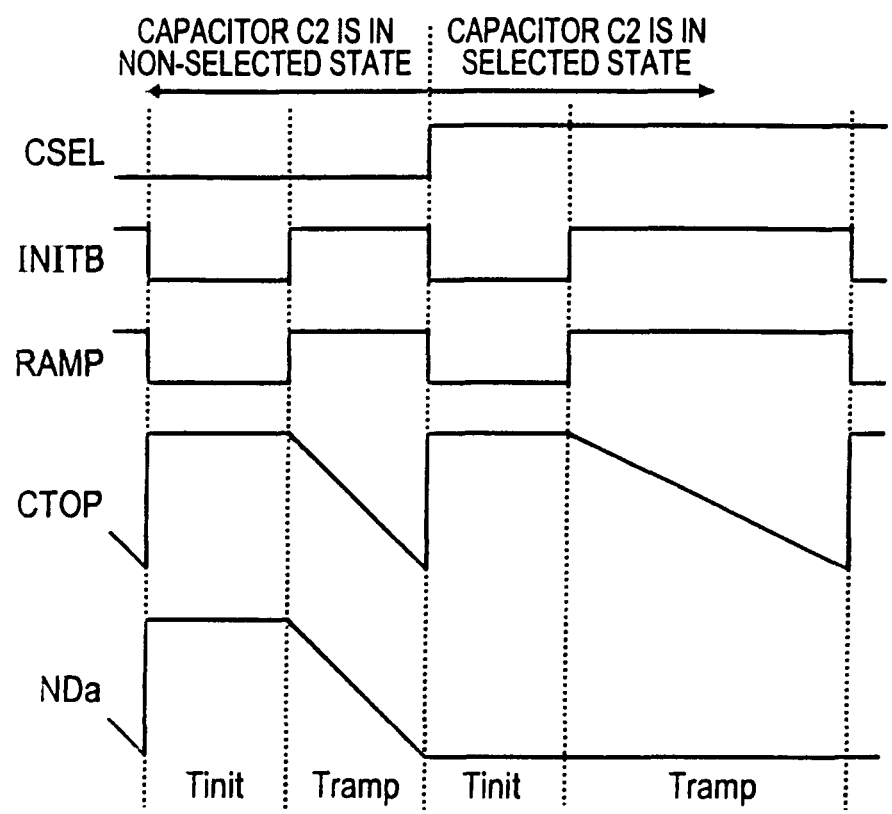
FIG. 2 is a timing chart illustrating an operation of the variable-capacitance device and an associated charging/discharging circuit shown in FIG. 1.

Next, the operation of the variable-capacitance device 1 is described below. FIG. 2 is a timing chart illustrating the operation of the variable-capacitance device 1 shown in FIG. 1. In the example shown in FIG. 2, the charge reset signal INITB and the ramp control signal RAMP are equal in phase. In the variable-capacitance device 1, the capacitor C2 is decoupled from the ground terminal during a period in which the capacitance switching signal CSEL is in the disable state (the low-level state in the present example). That is, in the variable-capacitance device 1, the capacitor C2 is non-selected (or disabled) during the period in which the capacitance switching signal CSEL is in the disable state. Therefore, in this state, the capacitance of the variable-capacitance device 1 is determined only by the capacitance of the capacitor C1. On the other hand, in the variable-capacitance device 1, the capacitor C2 is coupled to the ground terminal during a period in which the capacitance switching signal CSEL is in the enable state (the high-level state, in the present example). That is, in the variable-capacitance device 1, the capacitor C2 is selected (or enabled) during the period in which the capacitance switching signal CSEL is in the enable state. As a result, in this state, the variable-capacitance device 1 has capacitance equal to the sum of the capacitance of the capacitor C1 and the capacitance of the capacitor C2.

Thus, first, an explanation is given below as to the operation of the variable-capacitance device 1 in the period in which capacitance switching signal CSEL is in the disable state. The variable-capacitance device 1 is controlled via two period, i.e., a reset period Tinit and a ramp period Tramp. In the reset period Tinit, the charge reset signal INITB is in the enable state and the ramp control signal RAMP is in the disable state. In the reset period Tinit, the reset transistor RTr supplies the reset voltage (given by the power supply voltage VDD in the present example) to the output terminal CTOP. The current source Is is decoupled from the output terminal CTOP. The PMOS transistors P1 and P2 in the error correction circuit 10 are both turned on. As a result, the reset voltage (given by the power supply voltage VDD in the present example) is supplied to the capacitance switching node NDa. That is, in the reset period Tinit, both ends of the capacitor C2 are set to be equal in potential and thus the charge stored in the capacitor C2 becomes substantially equal to zero.

In the ramp period Tramp following the reset period Tinit, the charge reset signal INITB goes to the disable state and the ramp control signal RAMP goes to the enable state. In this ramp period Tramp, the reset transistor RTr turns off and thus the supplying of the reset voltage to the output terminal CTOP is stopped. The current source Is is coupled to the output terminal CTOP and thus the current source Is draws the current Is from the capacitor C1. The PMOS transistor P2 in the error correction circuit 10 turns off. As a result, the capacitance switching node NDa goes into a floating state, and the voltage of the capacitance switching node NDa drops as the voltage of the output terminal CTOP is reduced by the current Is. That is, during the ramp period Tramp, charging/discharging of the capacitor C2 does not occur, and thus the gradient of the voltage drop at the output terminal CTOP is determined only by the capacitance of the capacitor C1 and the current Is.

Next, the operation of the variable-capacitance device 1 in the period in which the capacitance switching signal CSEL is turned into the enable state is described. Also in this period, the variable-capacitance device 1 is controlled via two sub periods including the reset period Tinit and the ramp period Tramp. In this period, because the capacitance switching signal CSEL is in the enable state, the ground voltage VSS is supplied to the capacitance switching node NDa. In response to the capacitance switching signal CSEL, the PMOS transistor P1 in the error correction circuit 10 turns off. As a result, the reset voltage (given by the power supply voltage VDD in the present example) is not supplied to the capacitance switching node NDa in both the reset period Tinit and the ramp period Tramp.

In the reset period Tinit, the charge reset signal INITB goes to the enable state and the ramp control signal RAMP goes to the disable state. Thus, in this reset period Tinit, the reset transistor RTr supplies the reset voltage (the power supply voltage VDD in the present example) to the output terminal CTOP. As a result, charges of amounts corresponding to the reset voltage are stored in the respective capacitors C1 and C2. The current source Is is decoupled from the output terminal CTOP.

In the ramp period Tramp following the reset period Tinit, the charge reset signal INITB goes to the disable state and the ramp control signal RAMP goes to the enable state. In this ramp period Tramp, the reset transistor RTr turns off and thus the supplying of the reset voltage to the output terminal CTOP is stopped. The current source Is is coupled to the output terminal CTOP and the current source Is draws the current Is from the capacitors C1 and C2. As a result, the voltage at the output terminal CTOP decreases at a rate determined by the current Is and the total capacitance of capacitors C1 and C2. If the capacitor C2 is enable in the state in which the supplied current Is is maintained constant, the voltage at the output terminal CTOP decreases at a smaller rate than the rate in the period in which the capacitor C2 is disable.

Figure 3:
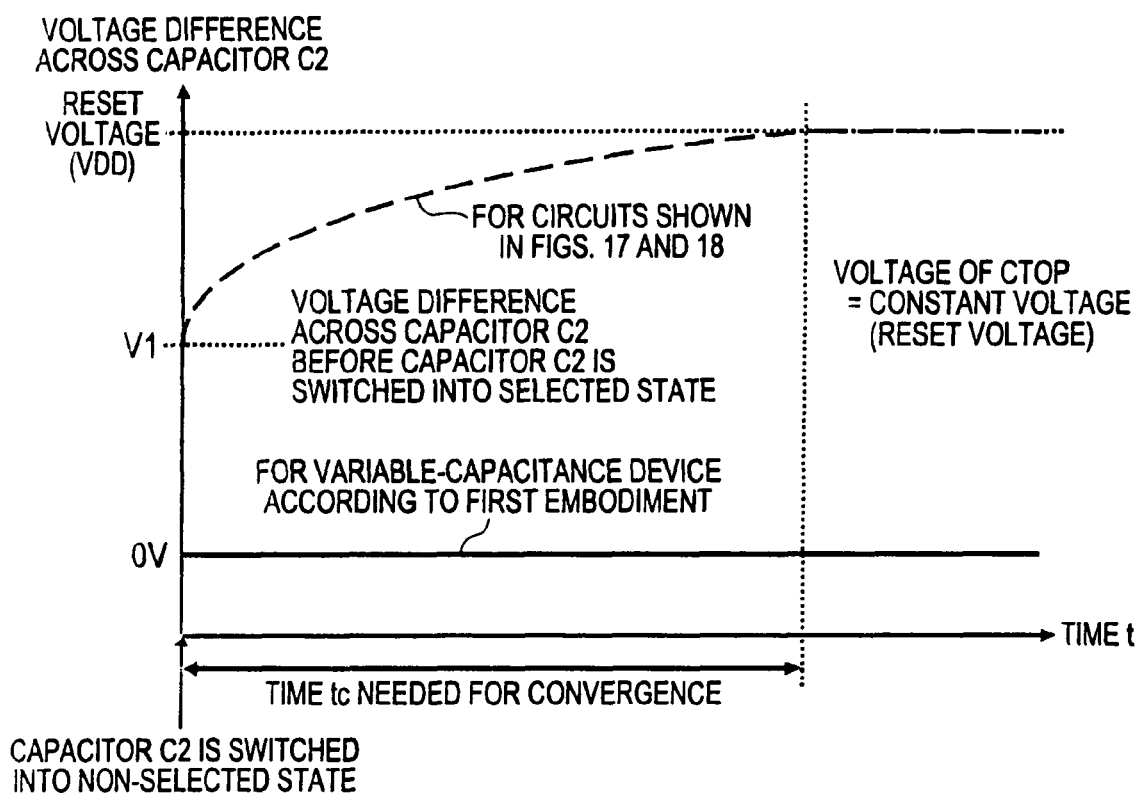
FIG. 3 is a graph illustrating a characteristic obtained after capacitance is switched for a variable-capacitance device according to the first embodiment of the invention and also illustrating, for the purpose of comparison, a characteristic obtained for a variable-capacitance device of the related art.
Figure 17:
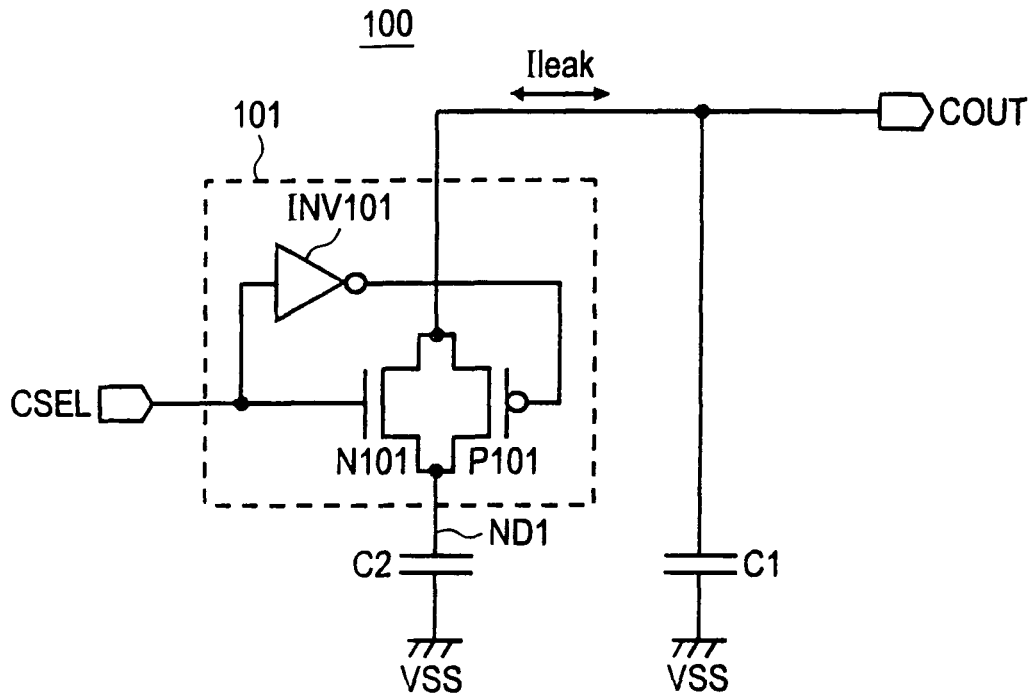
FIG. 17 is a circuit diagram of a variable-capacitance device equivalent to a variable-capacitance device disclosed in U.S. Pat. No. 5,594,388.
Figure 18:
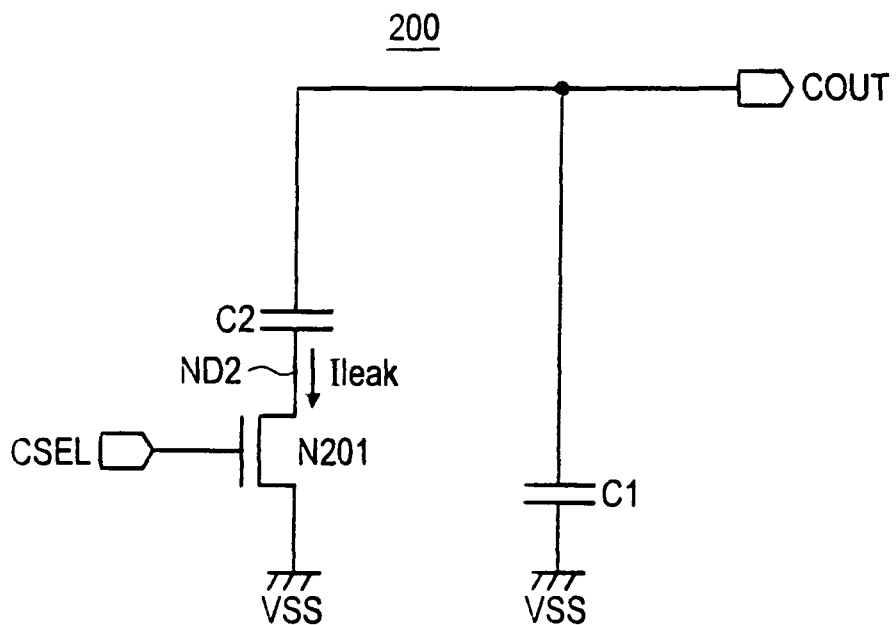
FIG. 18 is a circuit diagram of a variable-capacitance device equivalent to a variable-capacitance device disclosed in Japanese Patent Laid-Open No. 2008-252774.

Next, an explanation is given below as to a change in voltage across the capacitor C2 in the variable-capacitance device 1 in a state in which the capacitor C2 is not selected. For the purpose of comparison, an explanation is also given for the case of the variable-capacitance devices shown in FIG. 17 and FIG. 18. FIG. 3 is a graph illustrating a change in voltage difference across the capacitor C2 in the variable-capacitance device 1 in the state in which the capacitor C2 is not selected. In FIG. 3, for the purpose of comparison, a change in voltage difference is also shown for the case of the variable-capacitance devices shown in FIG. 17 and FIG. 18.

In the example shown in FIG. 3, the voltage at the output terminal CTOP is maintained at a constant value equal to the reset voltage (given by power supply voltage VDD in the present example). In the graph shown in FIG. 3, its origin is at a point of time at which the capacitor C2 is switched into the non-selected state. As shown in FIG. 3, in the variable-capacitance device 1 according to the present embodiment of the invention, when the reset voltage is supplied to the output terminal CTOP, the reset voltage is also supplied to the capacitance switching node NDa. As a result, the voltage difference across the capacitor C2 becomes substantially 0 V. In contrast, in the case of the variable-capacitance device 100 shown in FIG. 17, a leakage current Ileak flows into the terminal, on the side of the output terminal, of the capacitor C2 via the capacitance selection switch 101 and thus the voltage across the capacitor C2 is gradually increased by the leakage current Ileak. In the case of the variable-capacitance device 200 shown in FIG. 18, a leakage current Ileak flows through the capacitor C2 and the NMOS transistor N201 in a direction toward the ground terminal, and thus the voltage across the capacitor C2 is gradually increased by the leakage current Ileak. In the variable-capacitance devices shown in FIG. 17 and FIG. 18, as can be seen from the above discussion, a time tc is necessary for the voltage across the capacitor C2 to reach a steady value after the capacitor C2 is switched into the non-selected state. That is, in the variable-capacitance devices shown in FIG. 17 and FIG. 18, in this period with the length of tc, the capacitance changes due to the leakage current. In contrast, in the variable-capacitance device 1 according to the present embodiment of the invention, no change occurs in the voltage across the capacitor C2 after the capacitor C2 is switched into the non-selected state, and thus no change occurs in capacitance due to a leak current unlike the variable-capacitance devices shown in FIG. 17 and FIG. 18.

In the variable-capacitance device 1 according to the first embodiment, as described above, the value of the capacitance is switched by switching the state of the switch circuit (the NMOS transistor N1). In the variable-capacitance device 1, when the capacitor C2 is disabled, the ground-side terminal of the capacitor C2 is floated. In a period in which the charge stored in the capacitor C1 is reset by the reset voltage, the reset voltage is applied to the ground-side terminal of the capacitor C2. Thus, in the variable-capacitance device 1, the charge stored in the capacitor C2 is substantially eliminated in a period before the capacitor C1 is discharged. The ground-side terminal of the capacitor C2 is again switched into the floating state, and then the capacitor C1 is discharged. Thus, in the variable-capacitance device 1, even in the process of discharging the capacitor C1 during the period in which the capacitor C2 is in the non-selected state, it is possible to prevent the capacitor C2 from having a leakage current flowing therethrough, and thus it is possible to achieve high accuracy in capacitance.

Second Embodiment

Figure 4:
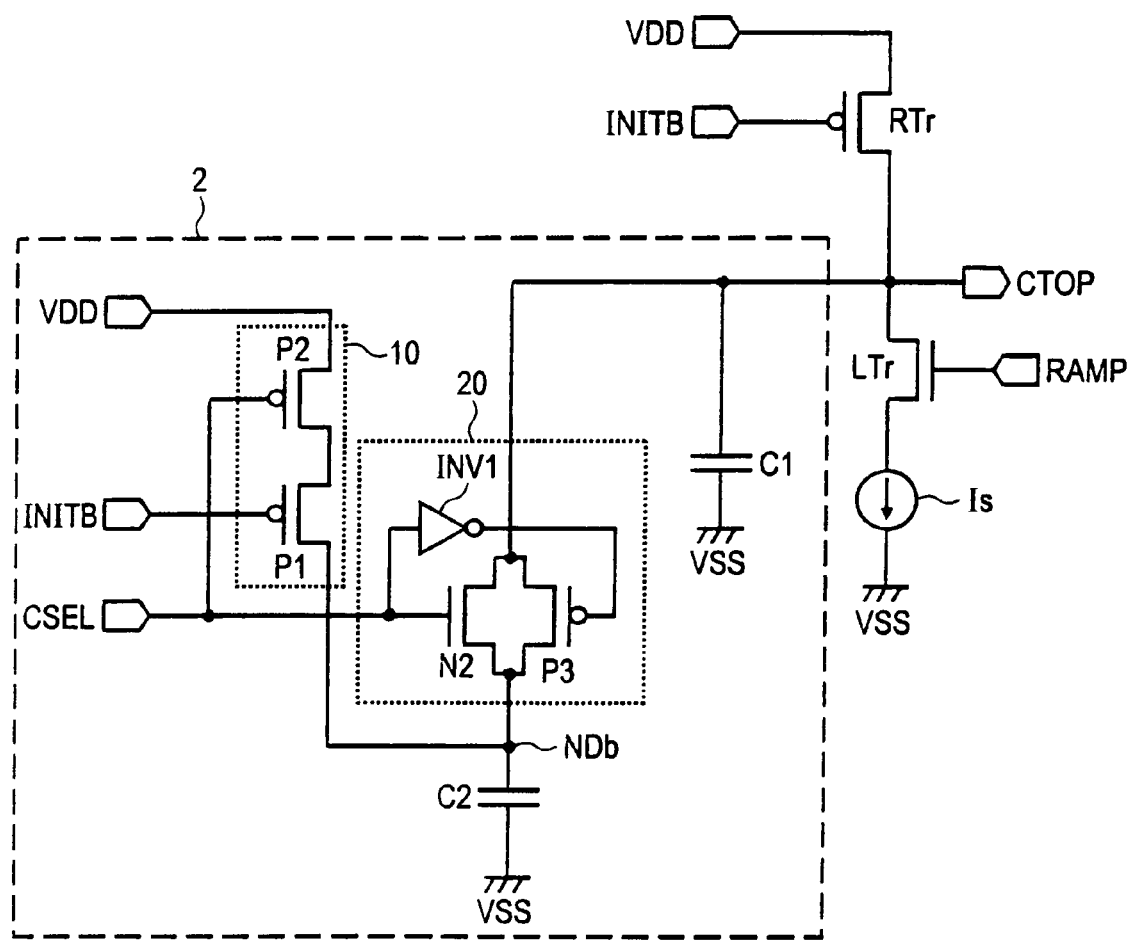
FIG. 4 is a circuit diagram of a variable-capacitance device according to a second embodiment of the present invention.

In a second embodiment described below, the variable-capacitance device 1 described above is modified such that the capacitor C2 and the capacitance selection switch is exchanged by each other. FIG. 4 is a circuit diagram of a variable-capacitance device 2 modified in such a manner according to the second embodiment. In FIG. 4, a circuit configured to charge and discharge the variable-capacitance device 2 is also shown as a peripheral circuit of the variable-capacitance device 2 as in the first embodiment. In the following description associated with the second embodiment, similar elements to those in the first embodiment are denoted by similar reference symbols/numerals, and a duplicated explanation thereof is omitted.

In the variable-capacitance device 2, as shown in FIG. 4, a first terminal of a capacitor C2 is coupled to a second terminal of a capacitance selection switch 20, and a second terminal of the capacitor C2 is coupled to a ground terminal. A first terminal of the capacitance selection switch 20 is coupled to an output terminal. In the second embodiment, a node at which the capacitance selection switch 20 and the capacitor C2 are coupled together is denoted by a capacitance switching node NDb. An error correction circuit 10 provides a reset voltage (given by a power supply voltage in the present example) to the capacitance switching node NDb in accordance with a charge reset signal INITB.

In the second embodiment, a transfer switch is used as the capacitance selection switch 20. Use of the transfer switch as the capacitance selection switch 20 ensures that the coupling of the capacitor C2 to the output terminal is maintained even in a state in which the voltage at the capacitance switching node NDb increases.

The transfer switch includes a PMOS transistor P3, an NMOS transistor N2, and an inverter INV1. A source of the PMOS transistor P3 and a source of the NMOS transistor N2 are coupled together at a node that functions as a second terminal of the capacitance selection switch 20. A drain of the PMOS transistor P3 and a drain of the NMOS transistor N2 are coupled together at a node that functions as a first terminal of the capacitance selection switch 20. A capacitance switching signal CSEL is input to a gate of the NMOS transistor N2, and the capacitance switching signal CSEL is also input to a gate of the PMOS transistor P3 via the inverter INV1. That is, the capacitance switching signal CSEL is input to both the gates of the PMOS transistor P3 and the gate of the NMOS transistor N2 such that the logical levels thereof are opposite to each other.

Figure 5:
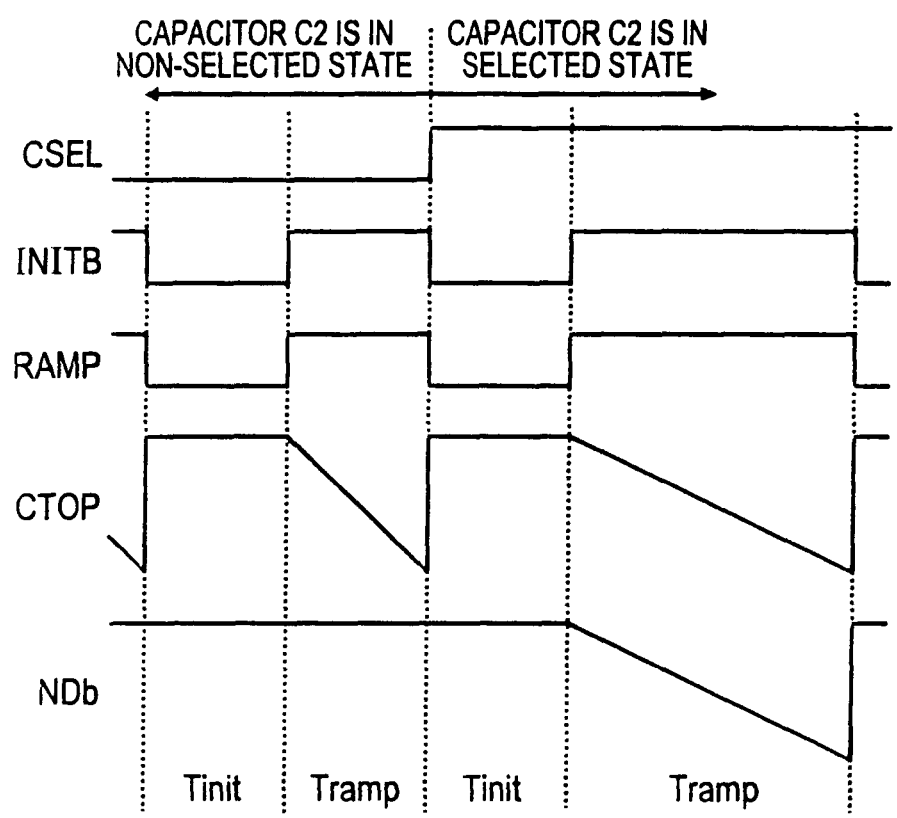
FIG. 5 is a timing chart illustrating an operation of the variable-capacitance device and an associated charging/discharging circuit shown in FIG. 4.

Next, the operation of the variable-capacitance device 2 is described below. FIG. 5 is a timing chart illustrating the operation of the variable-capacitance device 2. In the example shown in FIG. 5, the charge reset signal INITB and the ramp control signal RAMP are equal in phase. In the variable-capacitance device 2, the capacitor C2 is decoupled from the output terminal CTOP during a period in which the capacitance switching signal CSEL is in the disable state (the low-level state in the present example). That is, in the variable-capacitance device 2, the capacitor C2 is not selected (or disabled) during the period in which the capacitance switching signal CSEL is in the disable state. Therefore, in this state, the capacitance of the variable-capacitance device 2 is determined only by the capacitance of the capacitor C1. Furthermore, in the variable-capacitance device 2, the capacitor C2 is coupled to the output terminal CTOP during a period in which the capacitance switching signal CSEL is in the enable state (the high-level state in the present example). That is, in the variable-capacitance device 2, the capacitor C2 is selected (or enabled) during the period in which the capacitance switching signal CSEL is in the enable state. As a result, in this state, the variable-capacitance device 2 has capacitance equal to the sum of the capacitance of the capacitor C1 and the capacitance of the capacitor C2.

First, the operation of the variable-capacitance device 2 in the period in which the capacitance switching signal CSEL is in the disable state is described below. The variable-capacitance device 2 is controlled via two periods, i.e., a reset period Tinit and a ramp period Tramp. In the reset period Tinit, the charge reset signal INITB goes to the enable state and the ramp control signal RAMP goes to the disable state. In the reset period Tinit, the reset transistor RTr supplies the reset voltage (given by the power supply voltage VDD in the present example) to the output terminal CTOP. The current source Is is decoupled from the output terminal CTOP. The PMOS transistors P1 and P2 in the error correction circuit 10 are both turned on. Therefore, in this state, the reset voltage (given by the power supply voltage VDD in the present example) is supplied to the capacitance switching node NDb. Thus, in the reset period Tinit, both ends of the capacitance selection switch 20 become equal in potential.

In the ramp period Tramp following the reset period Tinit, the charge reset signal INITB goes to the disable state and the ramp control signal RAMP goes to the enable state. In this ramp period Tramp, the reset transistor RTr turns off and thus the supplying of the reset voltage to the output terminal CTOP is stopped. The current source Is is coupled to the output terminal CTOP and the current source Is draws the current Is from the capacitor C1. The PMOS transistor P2 in the error correction circuit 10 turns off. In this situation, because the capacitance switching signal CSEL is in the disable state, the capacitance selection switch 20 turns off. In the reset period Tinit, a charge of an amount corresponding to the reset voltage is stored in the capacitor C2. Therefore, when the error correction circuit 10 stops supplying the reset voltage to the capacitance switching node NDb, the voltage of the capacitance switching node NDb is maintained at the reset voltage because the capacitance selection switch 20 is in the OFF state. That is, during the ramp period Tramp, charging/discharging of the capacitor C2 does not occur, and thus the gradient of the voltage drop at the output terminal CTOP is determined only by the capacitance of the capacitor C1 and the current Is.

Next, the following describes the operation of the variable-capacitance device 2 in the period in which the capacitance switching signal CSEL is turned into the enable state. Also in this period, the variable-capacitance device 2 is controlled via two sub periods including the reset period Tinit and the ramp period Tramp. In this period, because the capacitance switching signal CSEL is in the enable state, the capacitance selection switch 20 turns on and the capacitor C2 is coupled to the output terminal CTOP. That is, the capacitance switching node NDb is coupled to the output terminal CTOP. In response to the capacitance switching signal CSEL, the PMOS transistor P1 in the error correction circuit 10 turns off. Therefore, in this state, the reset voltage (given by the power supply voltage VDD in the present example) is not supplied to the capacitance switching node NDb in both the reset period Tinit and the ramp period Tramp.

Furthermore, in the reset period Tinit, the charge reset signal INITB goes to the enable state and the ramp control signal RAMP is in the disable state. Furthermore, in the reset period Tinit, the reset transistor RTr supplies the reset voltage (given by the power supply voltage VDD in the present example) to the output terminal CTOP. As a result, charges of amounts corresponding to the reset voltage are stored in the respective capacitors C1 and C2. The current source Is is decoupled from the output terminal CTOP.

In the ramp period Tramp following the reset period Tinit, the charge reset signal INITB goes to the disable state and the ramp control signal RAMP goes to the enable state. In this ramp period Tramp, the reset transistor RTr turns off and thus the supplying of the reset voltage to the output terminal CTOP is stopped. The current source Is is coupled to the output terminal CTOP and the current source Is draws the current Is from the capacitors C1 and C2. Therefore, in this state, the voltage at the output terminal CTOP decreases at a rate determined by the current Is and the total capacitance of capacitors C1 and C2. If the capacitor C2 is enable in the state in which the supplied current Is is maintained constant, the voltage at the output terminal CTOP decreases at a smaller rate than in the period in which the capacitor C2 is disable.

Figure 6:
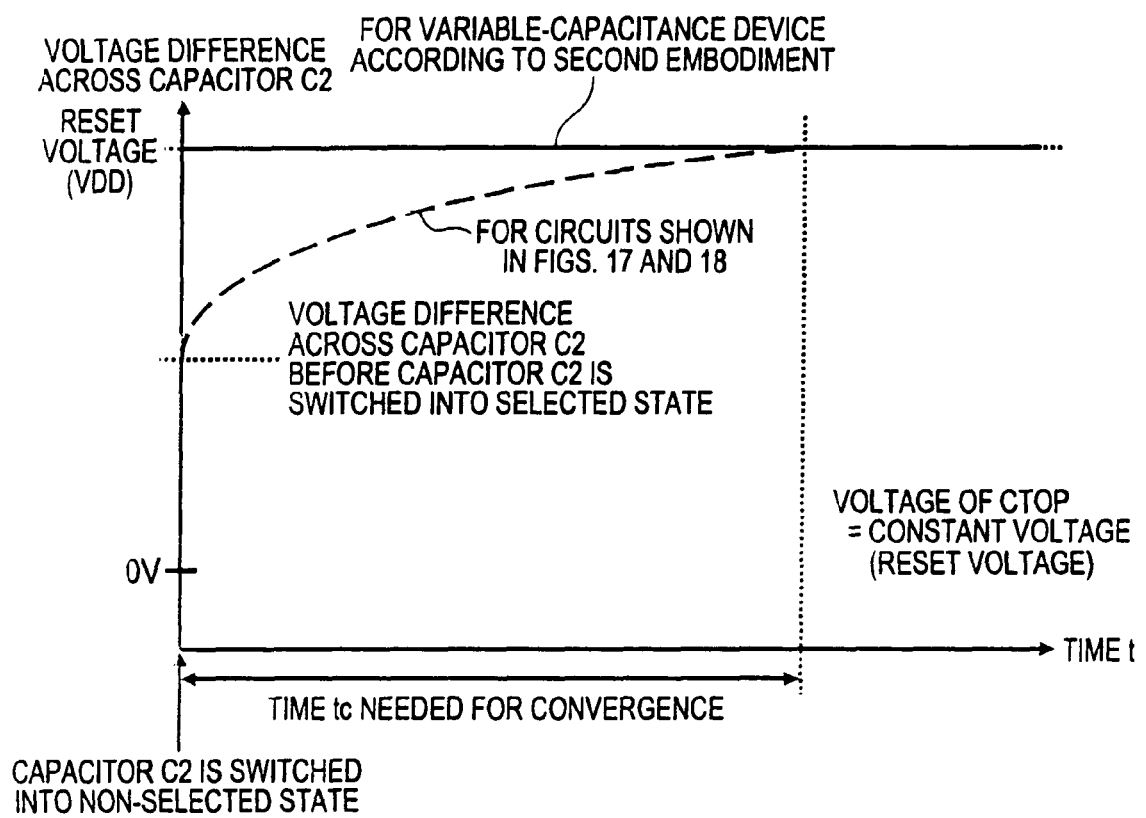
FIG. 6 is a graph illustrating a characteristic obtained after capacitance is switched for a variable-capacitance device according to the second embodiment of the invention and also illustrating, for the purpose of comparison, a characteristic obtained for a variable-capacitance device of the related art.

Next, an explanation is given below as to a change in voltage across the capacitor C2 in the variable-capacitance device 2 in a state in which the capacitor C2 is not selected. For the purpose of comparison, an explanation is also given for the case of the variable-capacitance devices shown in FIG. 17 and FIG. 18. FIG. 6 is a graph illustrating a change in voltage difference across the capacitor C2 in the variable-capacitance device 2 in the state in which the capacitor C2 is not selected. In FIG. 6, for the purpose of comparison, a change in voltage difference is also shown for the case of the variable-capacitance devices shown in FIG. 17 and FIG. 18.

In the example shown in FIG. 6, the voltage at the output terminal CTOP is maintained at a constant value equal to the reset voltage (given by the power supply voltage VDD in the present example). In the graph shown in FIG. 6, its origin is at a point of time at which the capacitor C2 is switched into the non-selected state. In the variable-capacitance device 2 according to the present embodiment, as shown in FIG. 6, when the reset voltage is supplied to the output terminal CTOP, the reset voltage is also supplied to the capacitance switching node NDb. As a result, the voltage difference across the capacitor C2 becomes substantially equal to the reset voltage. On the other hand, in the variable-capacitance device 100 shown in FIG. 17, a leakage current Ileak flows into the terminal, on the side of the output terminal, of the capacitor C2 via the capacitance selection switch 101, and thus the voltage across the capacitor C2 increases gradually. In the case of the variable-capacitance device 200 shown in FIG. 18, a leakage current Ileak flows from the terminal, on the side of the ground terminal, of the capacitor C2 via the NMOS transistor N201, and thus the voltage across the capacitor C2 increases gradually. In the variable-capacitance devices shown in FIG. 17 and FIG. 18, as can be seen from the above discussion, a time tc is necessary for the voltage across the capacitor C2 to reach a steady value after the capacitor C2 is switched into the non-selected state. That is, in the variable-capacitance devices shown in FIG. 17 and FIG. 18, in this period with the length of tc, the capacitance changes due to the leakage current. In contrast, in the variable-capacitance device 2 according to the present embodiment of the invention, no change occurs in the voltage across the capacitor C2 after the capacitor C2 is switched into the non-selected state. In this situation, there is a possibility that the variable-capacitance device 2 has a leakage current flowing via the capacitance selection switch 20. However, even if such a leakage current occurs, the voltage of the capacitance switching node NDb is set to be equal to the reset voltage during the reset period Tinit. Therefore, unlike the variable-capacitance devices shown in FIG. 17 and FIG. 18, the leakage current Ileak is constant without changing with time, and thus a change in capacitance with time due to the leakage current Ileak does not occurs.

In the variable-capacitance device 2 according to the second, as described above, the value of the capacitance is switched by switching the state of the capacitance selection switch 20. More specifically, in the variable-capacitance device 2, when the capacitor C2 is disabled, the voltage of the terminal, on the side coupled to the capacitor C2, of the capacitance selection switch 20 is set to be equal to the reset voltage during the reset period Tinit. As a result, in the variable-capacitance device 2, the voltage difference between the two terminals of the capacitance selection switch 20 becomes substantially equal to zero in a period before the capacitor C1 is discharged. Thereafter, supplying of the reset voltage to the terminal, on the side coupled to the capacitor C2, of the capacitance selection switch 20 is stopped, and then the capacitor C1 is discharged. Thus, in the variable-capacitance device 2, even in the process of discharging the capacitor C1 during the period in which the capacitor C2 is in the non-selected state, the leakage current flowing through the capacitance selection switch 20 is maintained constant, which makes it possible to increase the accuracy of the capacitance.

Third Embodiment

In the variable-capacitance device according to one of embodiments of the invention, as described above, the capacitance can be switched among high accuracy values. A functional circuit can be achieved using such a variable-capacitance device according to an embodiment of the invention. As an example of such a functional circuit, an oscillation circuit is described below as a third embodiment. The oscillation circuit described below is of a RC oscillation type in which its oscillation frequency is determined by a time constant determined by a current determined by a resistor and capacitance of a capacitor. The variable-capacitance device according to one of embodiments described above may be used in a frequency detection circuit in the oscillation circuit.

Figure 7:
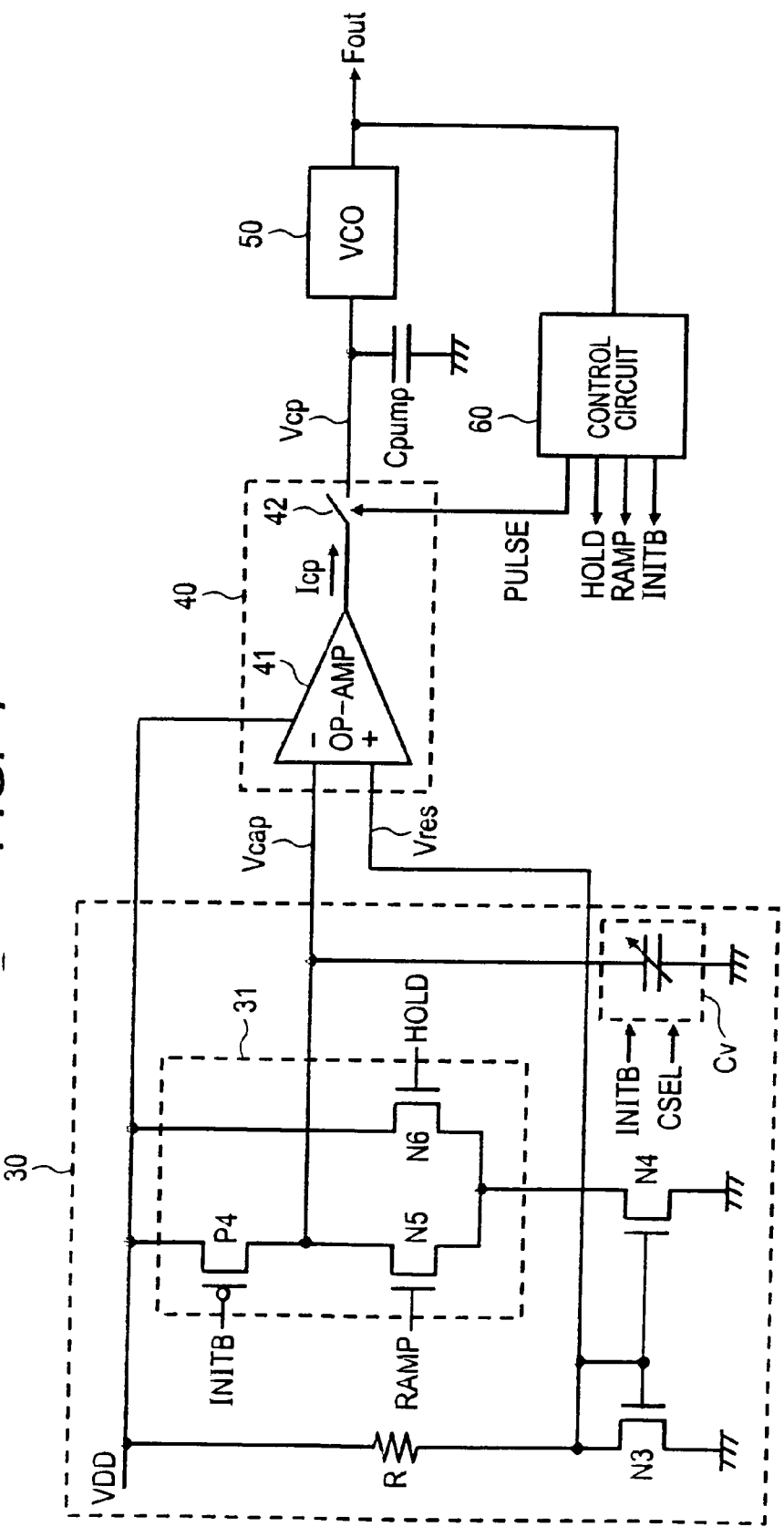
FIG. 7 is a block diagram illustrating an example of a circuit configuration of an oscillation circuit using a variable-capacitance device according to an embodiment of the present invention.

FIG. 7 is a block diagram illustrating an oscillation circuit 3 according to the third embodiment of the present invention. As shown in FIG. 7, the oscillation circuit 3 includes a frequency detection circuit 30, a differential amplifier 40, a voltage-controlled oscillator 50, a control circuit 60, and a filter capacitor Cpump.

The frequency detection circuit 30 produces a frequency detection voltage Vcap whose voltage level varies depending on a length of a period of an oscillation signal (hereinafter also referred to as an output signal Fout) based on timing control signals output by the control circuit 60. Note that the timing control signals include a charge reset signal INITB, a ramp control signal RAMP, and a hold control signal HOLD. According to these control signals, the frequency detection circuit 30 produces the frequency detection voltage Vcap.

As shown in FIG. 7, the frequency detection circuit 30 includes a ramp-and-hold circuit 31, NMOS transistors N3 and N4, a frequency setting resistor R, and a frequency setting capacitor Cv. One end of the frequency setting resistor R is coupled to a power supply terminal VDD, and the other end is coupled to the drain of the NMOS transistor N3. The gate and the drain of the NMOS transistor N3 are coupled together. The source of the NMOS transistor N3 is coupled to a ground terminal. The gate of the NMOS transistor N4 and the gate of the NMOS transistor N3 are coupled together. The source of the NMOS transistor N4 is coupled to the ground terminal. The drain of the NMOS transistor N4 is coupled to the ramp-and-hold circuit 31. In this configuration, the voltage difference between the power supply voltage and the diode voltage generated by the NMOS transistor N3 is applied across the frequency setting resistor R, and the value of the charging/discharging current is set by the current flowing through the frequency setting resistor R in this situation. The value of the charging/discharging current determined in this manner is transferred to the ramp-and-hold circuit 31 via a current mirror circuit formed by the NMOS transistors N3 and N4.

In accordance with the timing control signals, the ramp-and-hold circuit 31 supplies the charging/discharging current to the frequency setting capacitor Cv and resets the electric charge stored in the frequency setting capacitor Cv. The ramp-and-hold circuit 31 includes NMOS transistors N5 and N6 and a PMOS transistor P4. The NMOS transistors N5 and N6 form a differential pair. That is, the sources of the NMOS transistors N5 and N6 are coupled together. The charging/discharging current output from the drain of the NMOS transistor N4 is supplied to the sources (common node) of the NMOS transistors N5 and N6. The ramp control signal RAMP is input to the gate of the NMOS transistor N5, and the hold control signal HOLD is input to the gate of the NMOS transistor N6. The drain of the NMOS transistor N5 is coupled to the drain of the PMOS transistor P4 so as to form an output terminal of the ramp-and-hold circuit 31. The drain of the NMOS transistor N6 is coupled to a power supply terminal VDD. The charge reset signal INITB is input to the gate of the PMOS transistor P4. The source of the PMOS transistor P4 is coupled to the power supply terminal VDD.

The frequency setting capacitor Cv is coupled between the output terminal of the ramp-and-hold circuit 31 and the ground terminal. This frequency setting capacitor Cv is realized by the variable-capacitance device 1 according to the first embodiment. That is, the capacitance switching signal CSEL serving as a capacitance switching command signal is input to the frequency setting capacitor Cv. The frequency setting capacitor Cv produces the frequency detection voltage Vcap depending on the amount of charge stored therein. Note that the frequency detection voltage Vcap appears at the node on the side of the output terminal of the ramp-and-hold circuit 31.

In the ramp-and-hold circuit 31, when the charge reset signal INITB goes to the enable state (the low-level state, in the present example), the PMOS transistor P4 turns on. In the ramp-and-hold circuit 31, an amount of charge corresponding to the power supply voltage is stored in the frequency setting capacitor Cv thereby resetting the charge stored in the frequency setting capacitor Cv. In the ramp-and-hold circuit 31, when the charge reset signal INITB goes to the disable state (the high-level state, in the present example) and the ramp control signal RAMP goes to the enable state (the high-level state, in the present example), the PMOS transistor P4 turns off and the NMOS transistor N5 turns on. As a result, in the ramp-and-hold circuit 31, the charge is drawn out from the frequency setting capacitor Cv by the charging/discharging current. Furthermore, in the ramp-and-hold circuit 31, the ramp control signal RAMP goes to the disable state (the low-level state, in the present example) and the hold control signal HOLD goes to the enable state (the high-level state, in the present example), the NMOS transistor N5 turns off and the NMOS transistor N6 turns on. As a result, the ramp-and-hold circuit 31 stops discharging the frequency setting capacitor Cv and maintains the frequency detection voltage Vcap produced by the charge stored in the frequency setting capacitor Cv.

The differential amplifier 40 continuously changes the oscillation frequency setting current Icp according to the difference between the frequency detection voltage Vcap and the reference voltage Vres and outputs the resultant oscillation frequency setting current Icp to the filter capacitor Cpump. More specifically, the differential amplifier 40 includes an amplifier 41 and a switch circuit 42. The frequency detection voltage Vcap is input to an inverting input terminal of the amplifier 41 and the reference voltage Vres is input to a non-inverting input terminal of the amplifier 41. The amplifier 41 is, for example, a transconductance amplifier and is configured to output the oscillation frequency setting current Icp having a value corresponding to the difference between the frequency detection voltage Vcap and the reference voltage Vres. In the present embodiment, the gate voltage of the NMOS transistor N3 coupled to the frequency setting resistor R is used as the reference voltage Vres.

The switch circuit 42 is disposed between the output terminal of the amplifier 41 and the filter capacitor Cpump. The switch circuit 42 turns on or off in accordance with a pump control signal PULSE included in the timing control signals. More specifically, the switch circuit 42 turns on when the pump control signal PULSE is in the enable state (the high-level state, in the present example) and turns off when the pump control signal PULSE is in the disable state (the low-level state, in the present example).

Figure 8:
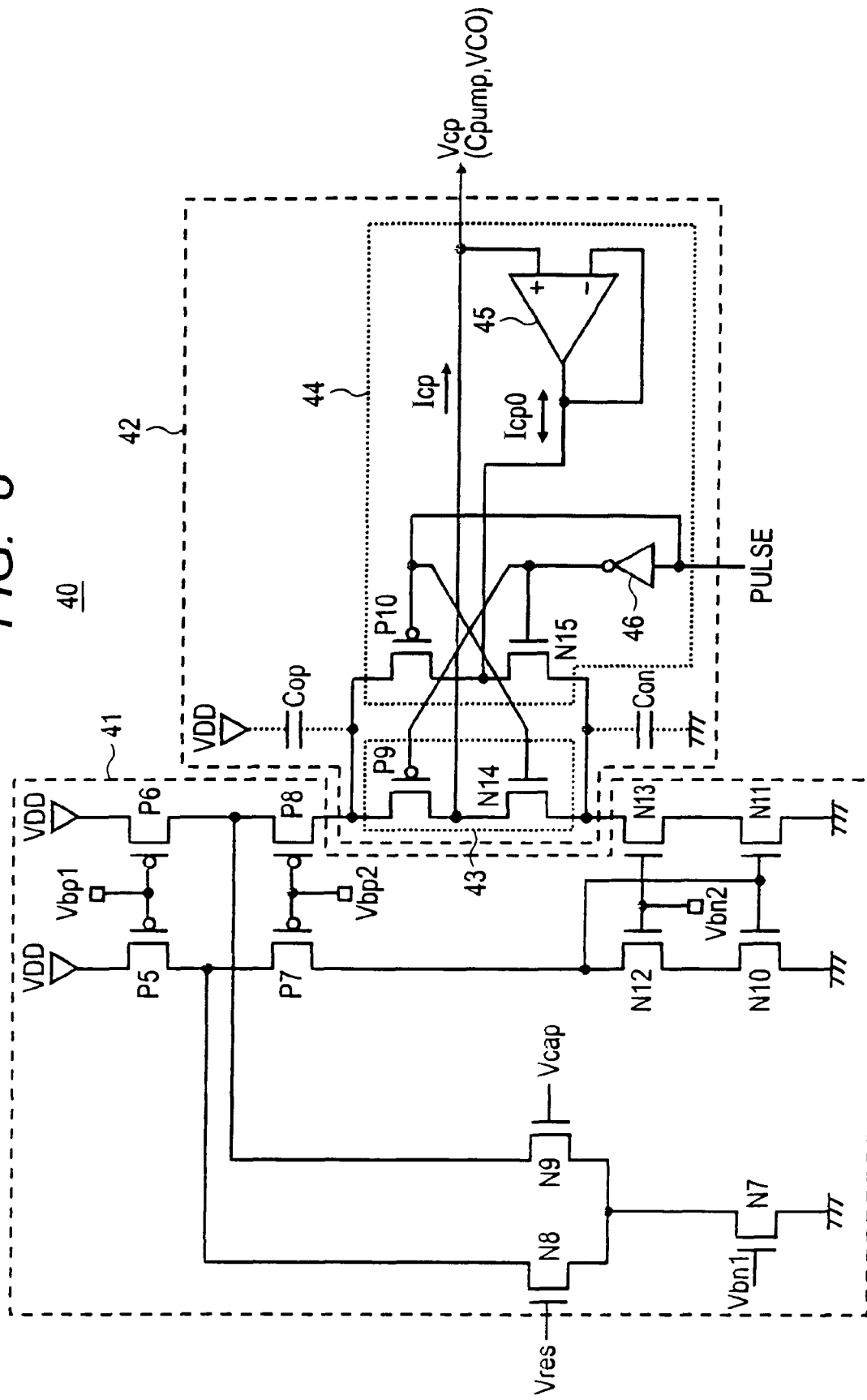
FIG. 8 is a circuit diagram illustrating an example of a circuit configuration of a differential amplifier in the oscillation circuit shown in FIG. 7.

The circuit configuration of the differential amplifier 40 is described in further detail below. FIG. 8 illustrates details of the circuit configuration of the differential amplifier 40. As shown in FIG. 8, the differential amplifier 40 includes the amplifier 41 and the switch circuit 42.

The differential amplifier 40 is configured in the form of a folded cascode amplifier. More specifically, the differential amplifier 40 includes NMOS transistors N7 to N13 and PMOS transistors P5 to P8. The source of the NMOS transistor N7 is coupled to the ground terminal and a constant voltage Vbn1 is input to the gate thereof. The NMOS transistors N8 and N9 form a differential pair and operate based on an operating current output by the NMOS transistor N7. The reference voltage Vres is input to the gate of the NMOS transistor N8, and the frequency detection voltage Vcap is input to the gate of the NMOS transistor N9. The drain of the NMOS transistor N8 is coupled to the drain of the PMOS transistor P5. The drain of the NMOS transistor N9 is coupled to the drain of the PMOS transistor P6.

The source of the PMOS transistor P5 and the source of the PMOS transistor P6 are coupled to the power supply terminal VDD. A constant voltage Vbp1 is input to the gate of the PMOS transistor P5 and the gate of the PMOS transistor P6. The source of the PMOS transistor P7 is coupled to the drain of the PMOS transistor P5. The source of the PMOS transistor P8 is coupled to the drain of the PMOS transistor P6. A constant voltage Vbp2 is input to the gate of the PMOS transistor P7 and the gate of the PMOS transistor P8. The drain of the PMOS transistor P8 functions as a terminal from which the oscillation frequency setting current Icp is output.

The source of the NMOS transistor N10 and the source of the NMOS transistor N11 are coupled to the ground terminal. The gate of the NMOS transistor N10 and the gate of the NMOS transistor N11 are coupled together. The source of the NMOS transistor N12 is coupled to the drain of the NMOS transistor N10. The source of the NMOS transistor N13 is coupled to the drain of the NMOS transistor N11. A constant voltage Vbn2 is input to the gate of the NMOS transistor N12 and the gate of the NMOS transistor N13. The drain of the NMOS transistor N12 is coupled to the drain of the PMOS transistor P7 and also to the gates of the NMOS transistors N10 and N11. The drain of the NMOS transistor N13 functions as a terminal via which the oscillation frequency setting current Icp is input.

The switch circuit 42 includes a first switch circuit 43 and a second switch circuit 44. The first switch circuit 43 switches the coupling state between the output terminal of the amplifier 41 and the filter capacitor Cpump in accordance with the pump control signal PULSE. The first switch circuit 43 includes a PMOS transistor P9 and an NMOS transistor N14. One terminal of the PMOS transistor P9 and one terminal of the NMOS transistor N14 are coupled to a node at which the filter capacitor Cpump is coupled to the voltage-controlled oscillator 50. The other terminal of the PMOS transistor P9 is coupled to the drain (serving as the current output terminal, in the present example) of the PMOS transistor P8. The other terminal of the NMOS transistor N14 is coupled to the drain (serving as the current input terminal, in the present example) of the NMOS transistor N13. The pump control signal PULSE is inverted by the inverter 46 described below and is input to the gate of the PMOS transistor P9. The pump control signal PULSE is input to the gate of the NMOS transistor N14.

During a period in which the first switch circuit 43 is in the OFF state, the second switch circuit 44 provides the oscillation frequency control voltage Vcp to the output terminal of the amplifier 41 and outputs a current Icp0 to cancel out a current that is input/output to/from the output terminal of the amplifier 41. The second switch circuit 44 includes a PMOS transistor P10, an NMOS transistor N15, a buffer circuit 45, and an inverter 46. One terminal of the PMOS transistor P10 and one terminal of the NMOS transistor N15 are coupled to an output terminal of the buffer circuit 45. The other terminal of the PMOS transistor P10 is coupled to the drain (serving as the current output terminal in the present example) of the PMOS transistor P8. The other terminal of the NMOS transistor N15 is coupled to the drain (serving as the current input terminal in the present example) of the NMOS transistor N13. The pump control signal PULSE is input to the gate of the PMOS transistor P10. The pump control signal PULSE is inverted by the inverter 46 and input to the gate of the NMOS transistor N15. The filter capacitor Cpump is coupled to a non-inverting input terminal of the buffer circuit 45. An inverting input terminal of the buffer circuit 45 is coupled to the output of the buffer circuit 45.

In the differential amplifier 40, when the pump control signal PULSE is in the enable state (the high-level state in the present example), the first switch circuit 43 turns on and thus the oscillation frequency setting current Icp is output to the filter capacitor Cpump. Furthermore, when the pump control signal PULSE is in the enable state, the second switch circuit 44 cuts off the transferring of the current Icp0 to the output terminal of the amplifier 41.

On the other hand, in the differential amplifier 40, when the pump control signal PULSE is in the disable state (the low-level state in the present example), the first switch circuit 43 turns off the second switch circuit 44 provides the current Icp0 to the output terminal of the amplifier 41. As a result, the output terminal of the differential amplifier 40 goes into a high impedance state when seen from the side of the filter capacitor Cpump. In this state, in the differential amplifier 40, parasitic capacitance Con is formed between the drain of the NMOS transistor N13 and the ground terminal, and parasitic capacitance Cop is formed between the drain of the PMOS transistor P8 and the power supply terminal VDD. The parasitic capacitance Con and the parasitic capacitance Cop cause the oscillation frequency control voltage Vcp to have a voltage change Vcp0 when the first switch circuit 43 switches from the OFF state into the ON state. The voltage change Vcpo can be expressed by equation (1) shown below, where Voutp denotes the drain voltage of the PMOS transistor N8 and Voutn denotes the drain voltage of the NMOS transistor N13.

$$Vcp0 = ((Voutp - Vcp)Cop - (Voutn - Vcp)Con)/Cpump \quad (1)$$

From equation (1), it can be seen that no voltage change Vcp0 occurs when Vcp=Voutn=Voutp. In view of the above, in the differential amplifier 40, in the period in which the first switch circuit 43 is in the OFF state, the second switch circuit 44 absorbs the current output from the amplifier 41 via the buffer circuit 45 and furthermore the second switch circuit 44 provides the oscillation frequency control voltage Vcp to the output terminal of the amplifier 41. Thus, in the differential amplifier 40, when the first switch circuit 43 is in the OFF state, the condition Vcp=Voutn=Voutp is satisfied and thus the voltage change Vcp0 is suppressed. Note that such a voltage change is called a charge share. In the oscillation circuit 3 according to the present embodiment of the invention, the oscillation frequency of the output signal Fout is determined by the voltage level of the oscillation frequency control voltage Vcp, and thus the suppression of the voltage change of the oscillation frequency control voltage Vcp results in a reduction in jitter of the output signal Fout.

The filter capacitor Cpump produces the oscillation frequency control voltage Vcp depending on the amount of charge stored by the oscillation frequency setting current Icp. One end of the filter capacitor Cpump is coupled to a node at which the output terminal of the differential amplifier 40 is coupled to the input terminal of the voltage-controlled oscillator 50, and the other end of the filter capacitor Cpump is coupled to the ground terminal. Thus, the filter capacitor Cpump produces the oscillation frequency control voltage Vcp depending on the oscillation frequency setting current Icp output by the differential amplifier 40, and the filter capacitor Cpump supplies the resultant oscillation frequency control voltage Vcp to the voltage-controlled oscillator 50.

The voltage-controlled oscillator 50 controls the oscillation frequency of the output signal Fout in accordance with the voltage level of the oscillation frequency control voltage Vcp.

The control circuit 60 generates timing control signals such that the logical levels thereof are switched according to the period of the output signal Fout. The timing control signals include the charge reset signal INITB, the ramp control signal RAMP, the hold control signal HOLD, and the pump control signal PULSE. The control circuit 60 generates a frequency-divided signal by dividing the frequency of the output signal Fout and switches the logical levels of the above-described control signals based on the count of the number of clocks of the frequency-divided signal. The timing of switching the logical levels of the timing control signals will be described in further detail below.

Figure 9:
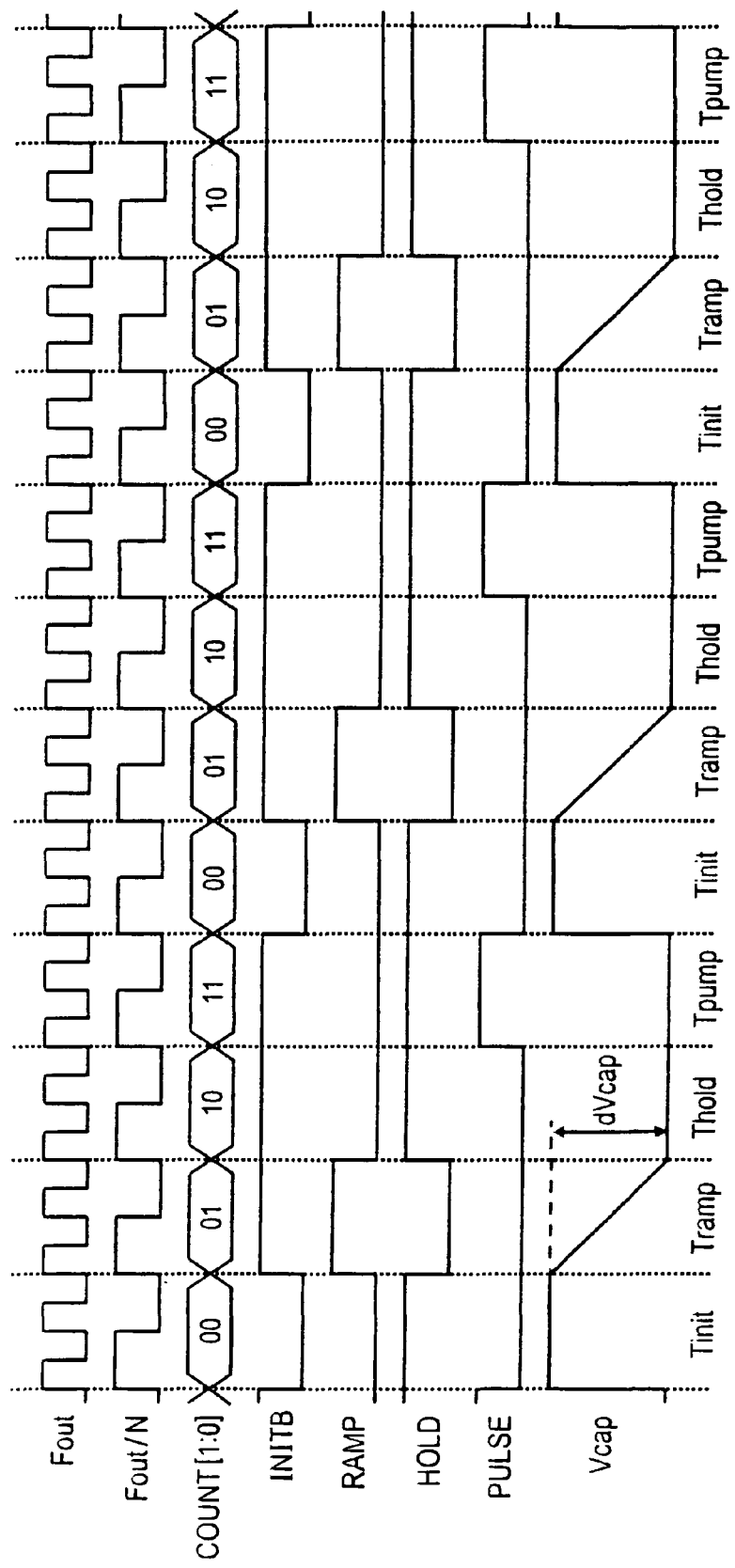
FIG. 9 is a timing chart illustrating an operation of a ramp-and-hold circuit in the oscillation circuit shown in FIG. 7.

FIG. 9 is a timing chart associated with the operation of the frequency detection circuit 30 and the control circuit 60. Referring to FIG. 9, the operation of the frequency detection circuit 30 and the timing of switching the logical levels of the timing control signals by the control circuit 60 are described below.

As shown in FIG. 9, the control circuit 60 generates a frequency-divided signal FD by dividing the frequency of the output signal Fout. In the example shown in FIG. 9, the frequency-divided signal FD is generated by dividing the frequency of the output signal Fout by 2. The control circuit 60 counts the number of clocks of the frequency-divided signal FD and generates a count value COUNT. In the example shown in FIG. 9, the count value COUNT is expressed in 2 bits and takes a value from 0 to 3. The control circuit 60 switches the logical levels of the timing control signals depending on the count value COUNT.

More specifically, when the count value is 0, the control circuit 60 switches the charge reset signal INITB into the low level (enable state), the ramp control signal RAMP into the low level (disable state), the hold control signal HOLD into the high level (enable state), and the pump control signal PULSE into the low level (disable state). Hereinafter, a period during which the count value=0 will be referred to as a reset period Tinit.

When the count value=1, the control circuit 60 switches the charge reset signal INITB into the high level (disable state), the ramp control signal RAMP into the high level (enable state), the hold control signal HOLD into the low level (disable state), and the pump control signal PULSE into low level (disable state). Hereinafter, a period during which the count value=1 will be referred to as a ramp period Tramp.

When the count value=2, the control circuit 60 switches the charge reset signal INITB into the high level (disable state), the ramp control signal RAMP into the low level (disable state), the hold control signal HOLD into the high level (enable state), and the pump control signal PULSE into the low level (disable state). Hereinafter, a period during which the count value=2 will be referred to as a hold period Thold.

When the count value=3, the control circuit 60 switches the charge reset signal INITB into the high level (disable state), the ramp control signal RAMP into the low level (disable state), the hold control signal HOLD into the high level (enable state), the pump control signal PULSE into the high level (enable state). Hereinafter, a period during which the count value=3 will be referred to as a pump period Tpump.

Next, the operation of the frequency detection circuit 30 is described. During the reset period Tinit, the frequency detection circuit 30 switches the PMOS transistor P4 into the ON state according to the charge reset signal INITB thereby resetting the electric charge stored in the frequency setting capacitor Cv into the amount of charge corresponding to the power supply voltage. As a result, the frequency detection voltage Vcap becomes substantially equal to the power supply voltage. In this state, the NMOS transistor N5 turns off in accordance with the ramp control signal RAMP, and the NMOS transistor N6 turns on in accordance with the hold control signal HOLD.

In the ramp period Tramp, the frequency detection circuit 30 turns off the PMOS transistor P4 in accordance with the charge reset signal INITB, turns on the NMOS transistor N5 in accordance with the ramp control signal RAMP, and turns off the NMOS transistor N6 in accordance with the hold control signal HOLD. That is, in the ramp period Tramp, the frequency detection circuit 30 draws the charge from the frequency setting capacitor Cv by the charging/discharging current. As a result, the voltage level of the frequency detection voltage Vcap gradually decreases. The gradient of the reduction in the frequency detection voltage Vcap is determined by the magnitude of the charging/discharging current and the capacitance of the frequency setting capacitor Cv. In the ramp period Tramp, the voltage level of the frequency detection voltage Vcap drops at a constant rate. Thus, in this ramp period Tramp, the voltage reduction dVcap in the frequency detection voltage Vcap is determined by the length of the ramp period Tramp (i.e., by the oscillation frequency of the output signal Fout).

In the hold period Thold, the frequency detection circuit 30 turns off the PMOS transistor P4 in accordance with the charge reset signal INITB, turns off the NMOS transistor N5 in accordance with the ramp control signal RAMP, and turns on the NMOS transistor N6 in accordance with the hold control signal HOLD. That is, in the hold period Thold, the frequency detection circuit 30 switches the node coupled to the frequency setting capacitor Cv into the high impedance state to maintain the voltage level of the frequency detection voltage Vcap produced by the frequency setting capacitor Cv.

In the pump period Tpump, the differential amplifier 40 supplies the oscillation frequency setting current Icp to the filter capacitor Cpump. In this state, the charge reset signal INITB, the ramp control signal RAMP, and the hold control signal HOLD, which are applied to the frequency detection circuit 30, are the same for the hold period Thold and the pump period Tpump. Therefore, in the pump period Tpump, no change occurs in the voltage level of the frequency detection voltage Vcap output by the frequency detection circuit 30.

Figure 10:
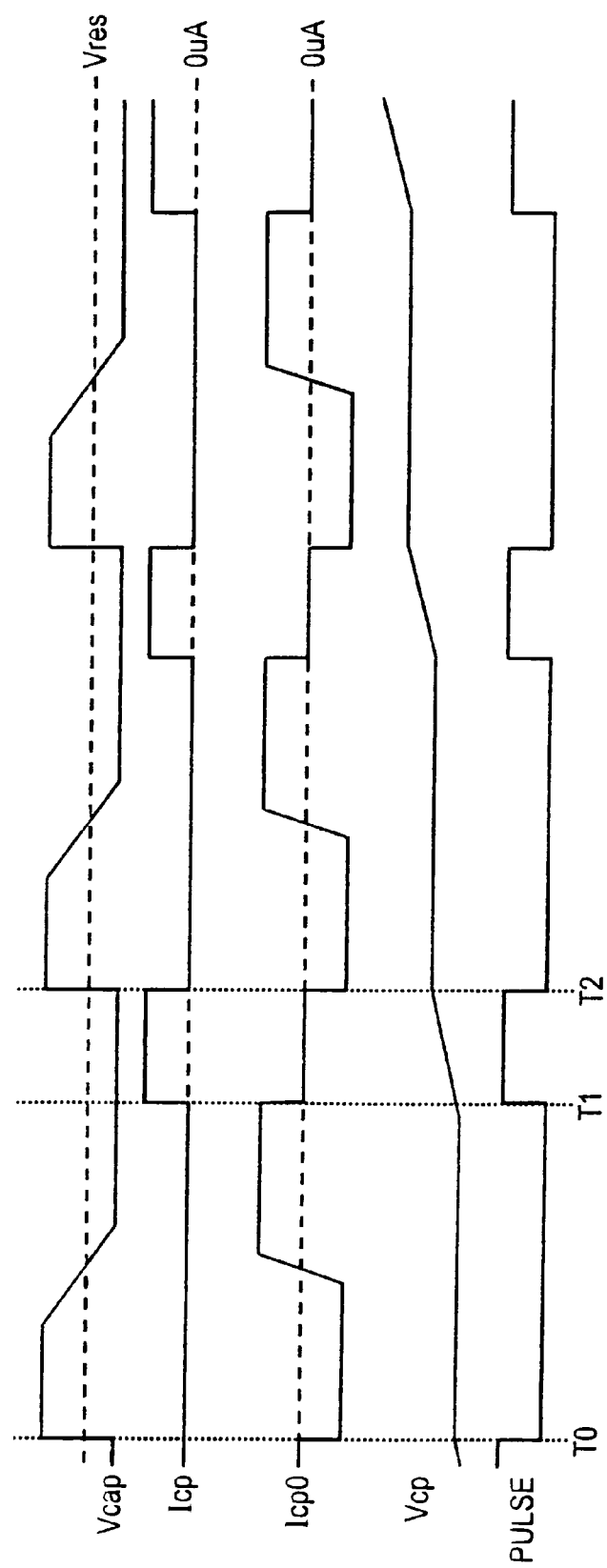
FIG. 10 is a timing chart illustrating an operation of the differential amplifier in the oscillation circuit shown in FIG. 7.

Next, the operation of the differential amplifier 40 is described. FIG. 10 is a timing chart illustrating the operation of the differential amplifier 40. In the example shown in FIG. 10, a period from time T0 to T2 corresponds to one set of a reset period Tinit, a ramp period Tramp, a hold period Thold, and a pump period Tpump shown in FIG. 9. A period from time T1 to T2 corresponds to one pump period shown in FIG. 9.

The differential amplifier 40 outputs the current Icp depending on the voltage difference between the frequency detection voltage Vcap and the reference voltage Vres. However, in the period from time T0 to T1, because the pump control signal PULSE is in the disable state (the low-level state in the present example), the first switch circuit 43 turns off and thus the frequency detection voltage Vcap is maintained constant. On the other hand, the amplifier 41 outputs a current depending on the voltage difference between the frequency detection voltage Vcap and the reference voltage Vres. This current is cancelled out by the current Icp0 by the second switch circuit 44 and thus the output voltage of the amplifier 41 is set to Vcp.

When the pump control signal PULSE goes to the enable state (the high-level state, in the present example) at the time T1, the first switch circuit 43 turns on and the second switch circuit 44 turns off. As a result, the differential amplifier 40 outputs the current Icp to the filter capacitor Cpump in accordance with the voltage difference between the frequency detection voltage Vcap and the reference voltage Vres. As a result, the oscillation frequency control voltage Vcp has a corresponding change. In the example shown in FIG. 10, the oscillation frequency setting current Icp is output in a positive direction (that causes the filter capacitor Cpump to be charged), and thus the frequency detection voltage Vcap increases in the period from time T1 to T2.

Figure 11:
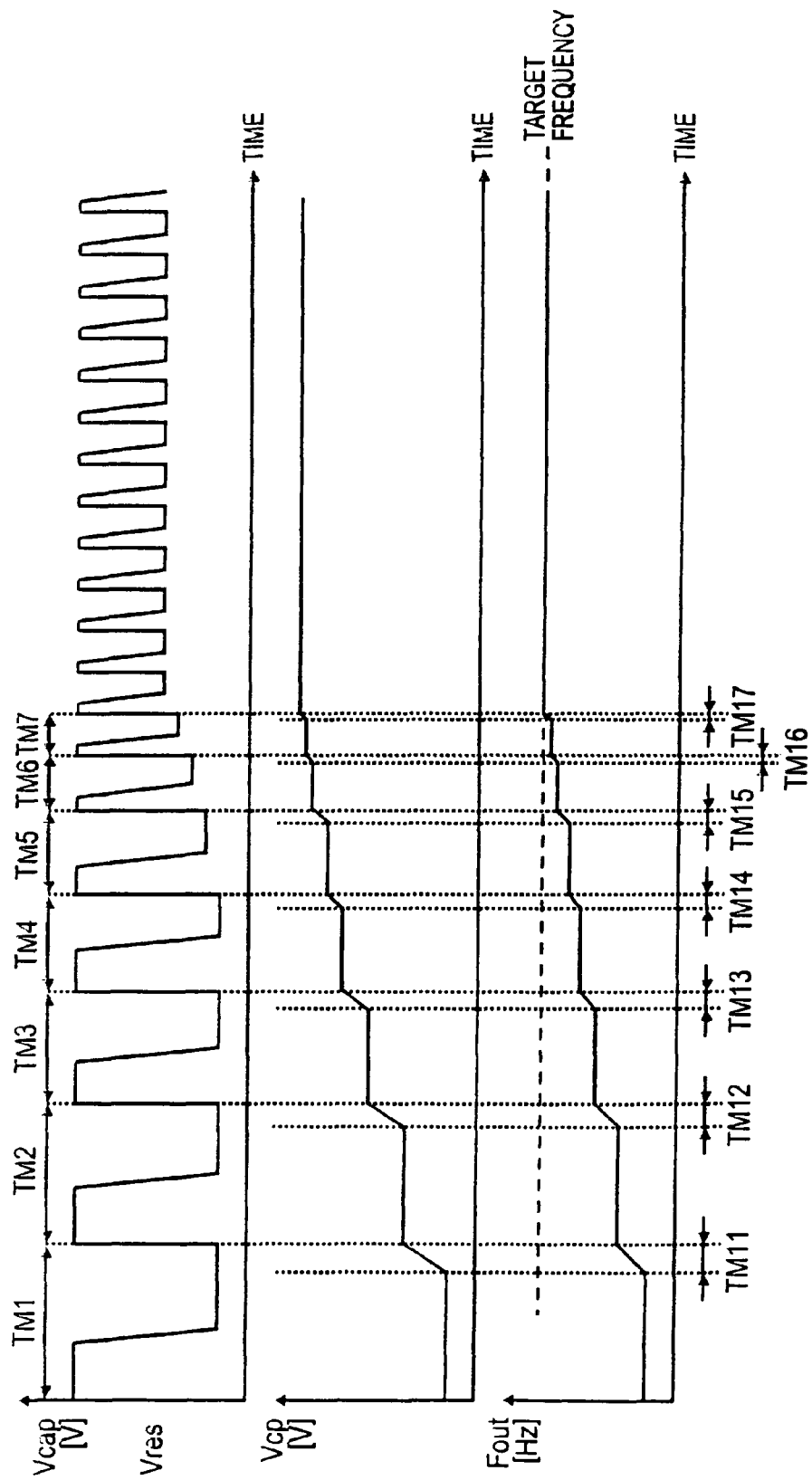

Next, the following describes the total operation of the oscillation circuit 3 according to the third embodiment of the invention. FIG. 11 is a timing chart illustrating the operation of the oscillation circuit 3 according to the third embodiment of the invention. Note that the timing chart shown in FIG. 11 shows only changes in the frequency detection voltage Vcap, the oscillation frequency control voltage Vcp, and the output signal Fout. Also note that in the timing chart shown in FIG. 11, it is assumed that the operation of the oscillation circuit 3 starts at an origin of a time axis (horizontal axis).

As shown in FIG. 11, the oscillation circuit 3 increases the oscillation frequency control voltage Vcp stepwise from one period to next over TM1 to TM7. Each of the periods TM1 to TM7 includes one set of a reset period Tinit, a ramp period Tramp, a hold period Thold, and a pump period Tpump shown in FIG. 9. Because the frequency of the output signal Fout increases stepwise from one period to next, the period length gradually decreases from one period to next over TM1 to TM7. This is because the timing control signals are generated based on the period of the output signal Fout. Each of the periods TM11 to TM17 shown in FIG. 11 corresponds to one pump period Tpump.

After the end of the period TM7, the low-level voltage of the frequency detection voltage Vcap becomes substantially equal to the reference voltage Vres. As a result, in the oscillation circuit 3, the oscillation frequency setting current Icp output by the differential amplifier 40 becomes substantially equal to 0. Therefore, after the low-level voltage of thee frequency detection voltage Vcap becomes substantially equal to the reference voltage Vres, this state is maintained. Furthermore, because the frequency detection voltage Vcap is maintained constant, the oscillation frequency of the output signal Fout is also maintained constant. That is, in the oscillation circuit 3, after the oscillation frequency of the output signal Fout reaches the target value, no jitter occurs in the output signal Fout.

In the oscillation circuit 3 according to the third embodiment, as described above, the filter capacitor Cpump produces the oscillation frequency control voltage Vcp according to the oscillation frequency setting current Icp. In this process, in the oscillation circuit 3, the differential amplifier 40 outputs the oscillation frequency setting current Icp whose value continuously changes according to the voltage difference between the frequency detection voltage Vcap and the reference voltage Vres. That is, when there is a difference between the frequency detection voltage Vcap and the reference voltage Vres, the oscillation frequency setting current Icp has a value corresponding to the voltage difference. On the other hand, when there is no difference between the frequency detection voltage Vcap and the reference voltage Vres, the oscillation frequency setting current Icp is substantially equal to 0. Therefore, in the oscillation circuit 3, in the state in which the frequency of the output signal Fout is equal to the target value (more specifically, when the frequency detection voltage Vcap is equal to the reference voltage Vres, in the present example), no change occurs in the oscillation frequency control voltage Vcp even when the pump control signal PULSE turns into the enable state. That is, in the oscillation circuit 3, after the oscillation frequency of the output signal Fout becomes equal to the target value, no change occurs in the voltage value of the oscillation frequency control voltage Vcp, and thus no change occurs in the oscillation frequency of the output signal Fout that is determined by the voltage-controlled oscillator 50 according to the voltage value of the oscillation frequency control voltage Vcp. Thus, in the oscillation circuit 3, a reduction in jitter of the output signal Fout is achieved.

In the oscillation circuit 3, as described above, the oscillation frequency control voltage Vcp generated by the differential amplifier 40 is high in accuracy, and thus an error or jitter of the frequency of the output signal Fout depends on an error of the time constant determined by the capacitance of the frequency setting capacitor Cv and the value of the charging/discharging current. In such a situation, use of the variable-capacitance device according to the present embodiment makes it possible to increase the accuracy of the oscillation frequency of the output signal Fout generated by the oscillation circuit 3. In the oscillation circuit 3, it is possible to switch the capacitance of the frequency setting capacitor Cv by the capacitance switching signal CSEL. This allows an increase in versatility of the oscillation circuit 3.

In the oscillation circuit 3 according to the third embodiment of the invention, the differential amplifier 40 includes the switch circuit 42. This switch circuit 42 is controlled to be in the OFF state except for a period (more specifically, the pump period Tpump in the present example) in which the result of the differential amplification of the signal input to the differential amplifier 40 is reflected. In the oscillation circuit 3, the frequency detection voltage Vcap is deviated from a value based on the output signal Fout during the reset period Tinit and the ramp period Tramp. However, the switch circuit 42 is controlled to be maintained in the OFF state in periods other than the pump period thereby preventing the oscillation frequency from being affected by the deviation of the frequency detection voltage Vcap in the reset period Tinit and the ramp period Tramp. Thus, in the oscillation circuit 3, the oscillation frequency can be stable in any period.

In the oscillation circuit 3 according to the third embodiment, the switch circuit 42 includes the first switch circuit 43 and the second switch circuit 44. The second switch circuit 44 coupled to the output terminal of the amplifier 41 operates even in the period in which the first switch circuit 43 is in the OFF state. That is, even during the reset period Tinit and the ramp period Tramp in which a voltage difference occurs between the frequency detection voltage Vcap and the reference voltage Vres, the second switch circuit 44 absorbs the current output by the amplifier 41 so that the voltage at the output terminal of the amplifier 41 is maintained at the oscillation frequency control voltage Vcp. This makes it possible to suppress a change in the oscillation frequency control voltage Vcp caused by the charge share that can occur at a transition of the state of the first switch circuit 43 from the OFF state to the ON state. That is, in the oscillation circuit 3 according to the third embodiment of the invention, it is possible to suppress the jitter caused by the provision of the switch circuit 42.

In the oscillation circuit 3 according to the third embodiment of the invention, the reference voltage Vres is given by the diode voltage of the NMOS transistor N3 and the value of the charging/discharging current is set to be equal to the voltage difference between the power supply voltage VDD and the reference voltage Vres divided by the frequency setting resistor R. When the diode voltage decreases, the value of the charging/discharging current increases, which results in an increase in the gradient of the frequency detection voltage Vcap in the ramp period Tramp. The value of the charging/discharging current Ires can be expressed by equation (2) shown below using the frequency setting resistor R, the reference voltage Vres, and the power supply voltage VDD.

$$Ires = (VDD - Vres)/R \quad (2)$$

If the frequency detection voltage in the hold period Thold is denoted by Vcap(HOLD), Vcap(HOLD) can be expressed (3) shown below using the charging/discharging current Ires, the capacitance of the frequency setting capacitor C, and the length of the ramp period Tramp.

$$Vcap(HOLD) = VDD - (Ires \cdot Tramp)/C \quad (3)$$

In the oscillation circuit 3 according to the third embodiment, the frequency is corrected by using a feedback loop such that Vcap(HOLD)=Vres. From equations (2) and (3), the relation between the frequency of the output signal Fout and the ramp period Tramp can be determined as expressed in equation (4).

$$Fout = N/Tramp = N/RC \quad (4)$$

where N denotes the frequency division factor employed by the control circuit 60. That is, in the oscillation circuit 3 according to the third embodiment, the power supply voltage and the diode voltage of the NMOS transistor N3 are cancelled out, and the frequency of the output signal Fout is given as a function of only the frequency setting resistor R, the frequency setting capacitor C, and the frequency division factor N.

Fourth Embodiment

Figure 12:
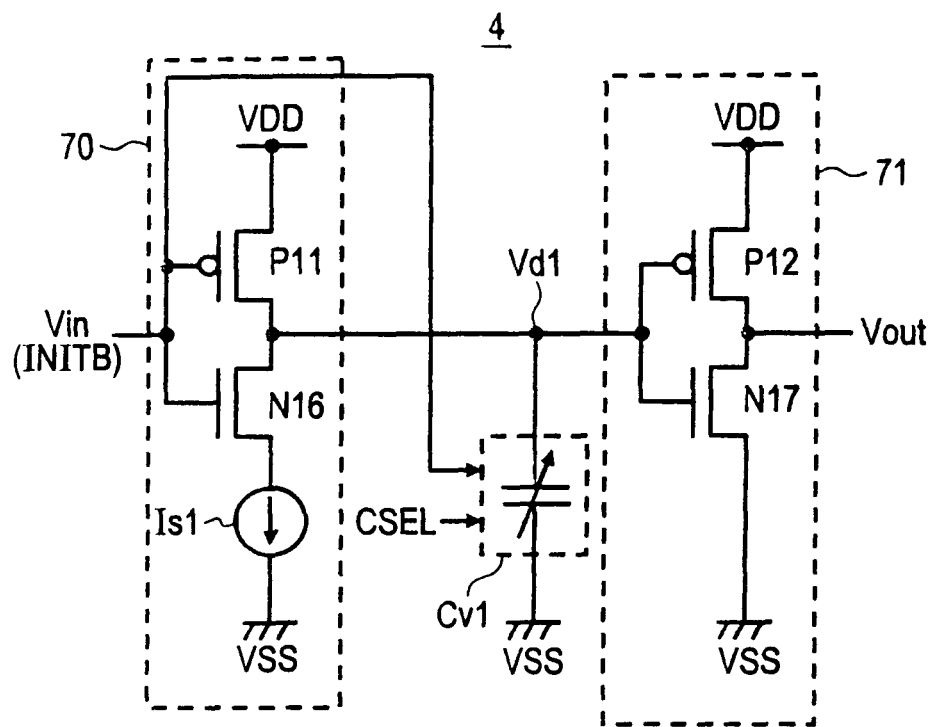
FIG. 12 is a block diagram illustrating a circuit configuration of a pulse width modulation circuit using a variable-capacitance device according to an embodiment of the invention.

The variable-capacitance devices 1 and 2 may be used to accurately set a time constant of a time constant circuit. Thus, in a fourth embodiment described below, as an example of a circuit using such a time constant circuit, a pulse width modulation circuit including the variable-capacitance device 1 or 2 is disclosed. FIG. 12 is a circuit diagram of the pulse width modulation circuit 4 according to the fourth embodiment. As shown in FIG. 12, the pulse width modulation circuit 4 includes inverters 70 and 71 and a variable-capacitance device Cv1. In the pulse width modulation circuit 4, a time constant circuit is formed by the variable-capacitance device Cv and the inverter 70. The variable-capacitance device Cv1 may be realized by the variable-capacitance device 1 or 2 according to the first or second embodiment described above. Thus, a capacitance switching signal CSEL is input to the variable-capacitance device Cv1. Furthermore, an input signal Vin functioning as a charge reset signal INITB is input to the variable-capacitance device Cv1.

The inverter 70 includes a PMOS transistor P11, an NMOS transistor N16, and a current source Is1. A power supply voltage VDD is supplied to the source of the PMOS transistor P11 and the input signal Vin is input to the gate of the PMOS transistor P11. The drain of the PMOS transistor P11 is coupled to the drain of the NMOS transistor N16. The source of the NMOS transistor N16 is coupled to a first terminal of the current source Is1 and the input signal Vin is input to the gate of the NMOS transistor N16. The drain of the NMOS transistor N16 is coupled to the drain of the PMOS transistor P11. An output terminal of the inverter 70 is given by a node at which the drain of the PMOS transistor P11 is coupled to the drain of the NMOS transistor N16. An intermediate output signal Vd1 is output from the output terminal of the inverter 70. The current source Is1 is coupled between the source of the NMOS transistor N16 and the ground terminal.

The inverter 71 includes a PMOS transistor P12 and an NMOS transistor N17. The power supply voltage VDD is supplied to the source of the PMOS transistor P12 and the first intermediate output signal Vd1 is input to the gate of the PMOS transistor P12. The drain of the PMOS transistor P12 is coupled to the drain of the NMOS transistor N17. The ground voltage VSS is supplied to the source of the NMOS transistor N17 and the first intermediate output signal Vd1 is supplied to the gate of the NMOS transistor N17. The drain of the NMOS transistor N17 is coupled to the drain of the PMOS transistor P12. An output terminal of the inverter 71 is given by a node at which the drain of the PMOS transistor P12 is coupled to the drain of the NMOS transistor N17. Note that a signal output from the inverter 71 functions as an output signal Vout of the pulse width modulation circuit 4.

Figure 13:
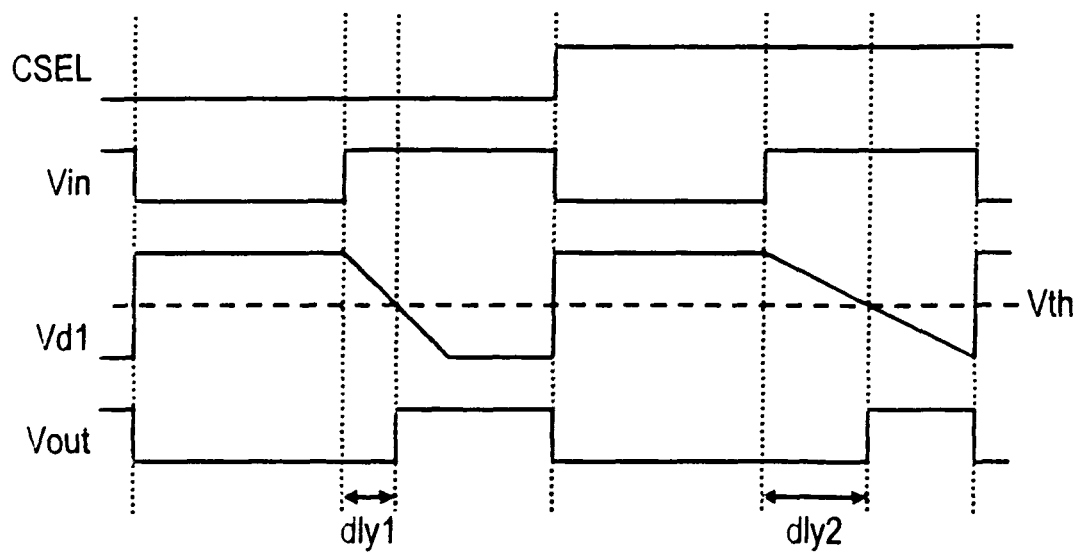
FIG. 13 is a timing chart illustrating an operation of the pulse width modulation circuit shown in FIG. 12.

Next, the operation of the pulse width modulation circuit 4 is described. FIG. 13 is a timing chart illustrating an operation of the pulse width modulation circuit 4. In the following description, it is assumed that the variable-capacitance device 1 is used as the variable-capacitance device Cv1.

The pulse width modulation circuit 4 modulates the pulse with of the output signal Vout according to the logical level of the capacitance switching signal CSEL. More specifically, when the capacitance switching signal CSEL is in the disable state (more specifically, the low level in the present example), the capacitance of the variable-capacitance device Cv1 is determined only by the capacitor C1. On the other hand, when the capacitance switching signal CSEL is in the enable state (more specifically, the high level in the present example), the capacitance of the variable-capacitance device Cv1 is given by the sum of the capacitance of the capacitor C1 and the capacitance of the capacitor C2.

First, the operation in the period in which the capacitance switching signal CSEL is in the disable state is described below. As shown in FIG. 13, in the pulse width modulation circuit 4, the intermediate output signal Vd1 is at the high level (more specifically, given by the power supply voltage VDD in the present example) when the input signal Vin is at the low level (more specifically, given by the ground voltage VSS in the present example). As a result, a charge of an amount corresponding to the power supply voltage VDD is stored in the capacitor C1 of the variable-capacitance device Cv1. When the input signal Vin is switched to the low level, the error correction circuit 10 in the variable-capacitance device Cv1 provides the power supply voltage VDD to the capacitance switching node NDa. As a result, the charge stored in the capacitor C2 is set to be substantially equal to 0. In the period in which the intermediate output signal Vd1 is at the high level, the output signal Vout is at the low level.

When the input signal Vin is switched from the low level to the high level, the NMOS transistor N16 turns on and thus the charge stored in the capacitor C1 is drawn out by the current source Is1. As a result of the drawing of the charge, the voltage level of the intermediate output signal Vd1 gradually drops down. When the voltage level of the intermediate output signal Vd1 goes down below a threshold voltage Vth of the inverter 71, the output signal Vout switches into the high level. In this situation, the presence of the variable-capacitance device Cv1 causes the intermediate output signal Vd1 to fall down at a slower rate than the rate at which the intermediate output signal Vd1 rises up. This causes the rising-up timing of the output signal Vout to be delayed by dly1 with respect to the falling-down timing of the input signal Vin.

Next, the operation in the period in which the capacitance switching signal CSEL is in the enable state is described below. In the period in which the capacitance switching signal CSEL is in the enable state, the capacitance of the variable-capacitance device Cv1 is greater than that in the period in which the capacitance switching signal CSEL is in the disable state. As a result, in the period in which capacitance switching signal CSEL is in the enable state, the intermediate output signal Vd1 falls down at a smaller rate than that in the period in which the capacitance switching signal CSEL is in the disable state. This causes the rising-up timing of the output signal Vout in this period to be delayed by dly2 with respect to the falling-down timing of the input signal Vin. Note that the delay dly2 is greater than the delay dly1.

As can be seen from the above description, in the pulse width modulation circuit 4, by the capacitance of the variable-capacitance device Cv1, the rising-up timing of the output signal Vout is set to be later than the rising-up timing of the input signal Vin. That is, in the pulse width modulation circuit 4, it is possible to set the output signal Vout so as to have a pulse width different from the pulse width of the input signal Vin. Furthermore, in the pulse width modulation circuit 4, it is possible to change the pulse width of the output signal Vout by switching the capacitance of the variable-capacitance device Cv1. In the pulse width modulation circuit 4 configured in the above-described manner, the accuracy of the pulse width depends on the accuracy of the capacitance of the variable-capacitance device Cv1. That is, to achieve high accuracy in the pulse width, it is necessary to increase the accuracy of the capacitance. To meet this requirement, the variable-capacitance devices 1 and 2 according to the embodiments of the invention are useful.

Fifth Embodiment

Figure 14:
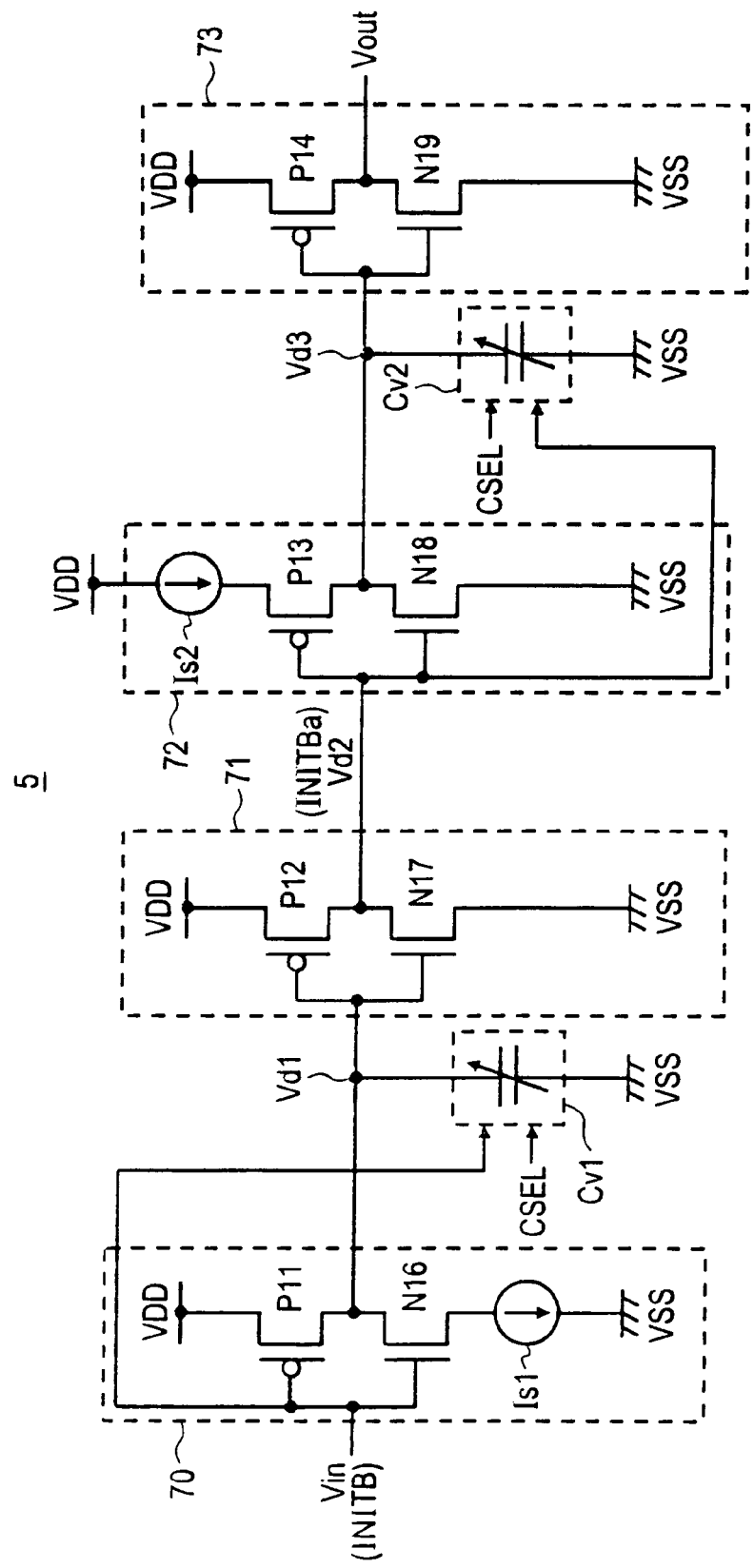
FIG. 14 is a circuit diagram of a delay circuit using a variable-capacitance device according to an embodiment of the invention.

In a circuit including a time constant circuit according to a fifth embodiment disclosed below, a delay circuit is realized using variable-capacitance devices 1 and 2. FIG. 14 illustrates a circuit configuration of a delay circuit 5 according to the fifth embodiment. As shown in FIG. 14, the delay circuit 5 includes inverters 70 to 73 and variable-capacitance devices Cv1 and Cv2. In the delay circuit 5, a first time constant circuit is formed by the inverter 70 and the variable-capacitance device Cv1, and a second time constant circuit is formed by the inverter 72 and the variable-capacitance device Cv2. The inverters 70 and 71 and the variable-capacitance device Cv1 are similar to those used in the pulse width modulation circuit 4 according to the fourth embodiment, and thus a further description thereof is omitted. In the following description, a signal corresponding to the intermediate output signal Vd1 in the fourth embodiment is referred to as a first intermediate output signal Vd1, and a signal corresponding to the output signal Vout is referred to as a second intermediate output signal Vd2.

The inverter 72 includes a PMOS transistor P13, an NMOS transistor N18, and a current source Is2. The PMOS transistor P13 is coupled such that a source thereof is coupled with the current source Is2, the second intermediate output signal Vd2 is input to a gate thereof, and a drain thereof is coupled with a drain of the NMOS transistor N18. The NMOS transistor N18 is coupled such that a ground voltage VSS is supplied to a source thereof, the second intermediate output signal Vd2 is input to a gate thereof, and the drain thereof is coupled with the drain of the PMOS transistor P13. A node at which the drain of the PMOS transistor P13 and the drain of the NMOS transistor N18 are coupled together functions as an output terminal of the inverter 72. The inverter 72 outputs a third intermediate output signal Vd3 from this output terminal. The current source Is2 is coupled between the source of the PMOS transistor N13 and the power supply terminal.

The inverter 73 includes a PMOS transistor P14 and an NMOS transistor N19. The PMOS transistor P14 is coupled such that a source thereof is coupled with a power supply voltage VDD, the third intermediate output signal Vd3 is input to the gate thereof, and a drain thereof is coupled with a drain of an NMOS transistor N17. The NMOS transistor N17 is coupled such that the ground voltage VSS is supplied to a source thereof, the third intermediate output signal Vd3 is input to a gate thereof, and the drain thereof is coupled with the drain of the PMOS transistor P14. A node at which the drain of the PMOS transistor P14 and the drain of the NMOS transistor N19 are coupled together functions as an output terminal of the inverter 73. Note that a signal output from the inverter 73 functions as an output signal Vout of the delay circuit 5.

Figure 15:
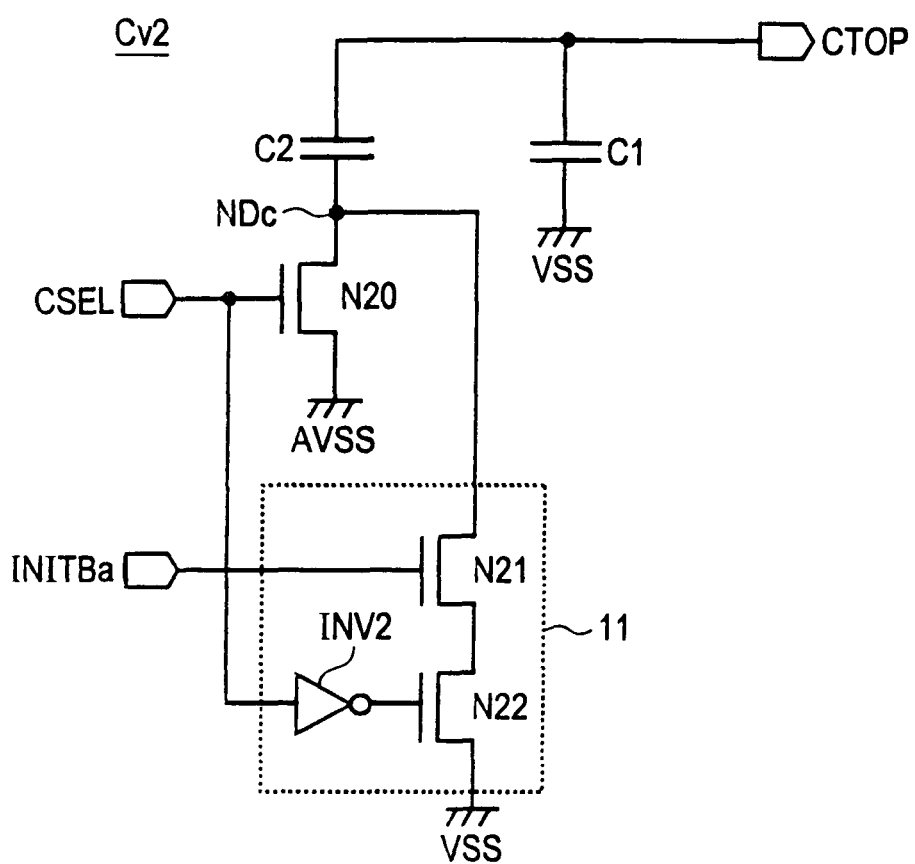
FIG. 15 is a circuit diagram of a variable-capacitance device used in the delay circuit shown in FIG. 14.

The variable-capacitance device Cv2 is disposed between the output terminal of the inverter 72 and the ground terminal. The ground voltage VSS functioning as the reset voltage is given to the variable-capacitance device Cv2. For this reason, the circuit configuration is different from that associated with the variable-capacitance device 1. FIG. 15 illustrates the circuit configuration associated with the variable-capacitance device Cv2.

As shown in FIG. 15, the variable-capacitance device Cv2 includes a first capacitance element (a capacitor C1 in the present example), a second capacitance element (a capacitor C2 in the present example), a capacitance selection switch (an NMOS transistor N20 in the present example), and an error correction circuit 11.

The capacitor C1 is coupled between the first power supply terminal (more specifically, the ground terminal that supplies the ground voltage VSS in the present example) and the output terminal CTOP. In the present embodiment, the output terminal CTOP is coupled to the output terminal of the inverter 72. The capacitor C2 is provided such that the capacitor C2 is coupled in parallel to the capacitor C1 and coupled in series to the NMOS transistor N20. The NMOS transistor N20 is turned on and off in accordance with a capacitance switching signal CSEL. The source of the NMOS transistor N20 is coupled to the ground terminal the drain thereof is coupled to the capacitor C2, and the capacitance switching signal CSEL is input to the gate thereof. A first terminal of the capacitor C2 is coupled to the output terminal CTOP and a second terminal of the capacitor C2 is coupled to the drain of the NMOS transistor N20. Hereinafter, a node at which the capacitor C2 and the NMOS transistor N20 are coupled together is denoted by a capacitance switching node NDc.

When the NMOS transistor N20 is in the OFF state, the error correction circuit 11 sets the capacitance switching node NDc so as to have substantially the same voltage as the voltage of the output terminal CTOP in accordance with the charge reset signal INITB (the second intermediate output signal Vd2 in the present embodiment) that causes the output terminal CTOP to be reset to the reset voltage. The error correction circuit 11 includes NMOS transistors N21 and N22 and an inverter INV2. The power supply voltage VDD is supplied to the source of the NMOS transistor N22, and the inverted signal of the capacitance switching signal CSEL is input to the gate of the NMOS transistor N22 via the inverter INV2. The drain of the NMOS transistor N22 is coupled to the source of the NMOS transistor N21. The charge reset signal INITB is input to the gate of the NMOS transistor N21 and the drain of the NMOS transistor N21 is coupled to the capacitance switching node NDc.

In the variable-capacitance device Cv2, in the period in which the charge of the capacitor C1 is reset when the capacitor C2 is in the non-selected state, the voltage across the capacitor C2 is set to be substantially equal to 0 thereby resetting the charge of the capacitor C2. That is, the basis operation is similar to that of the variable-capacitance device 1.

Figure 16:
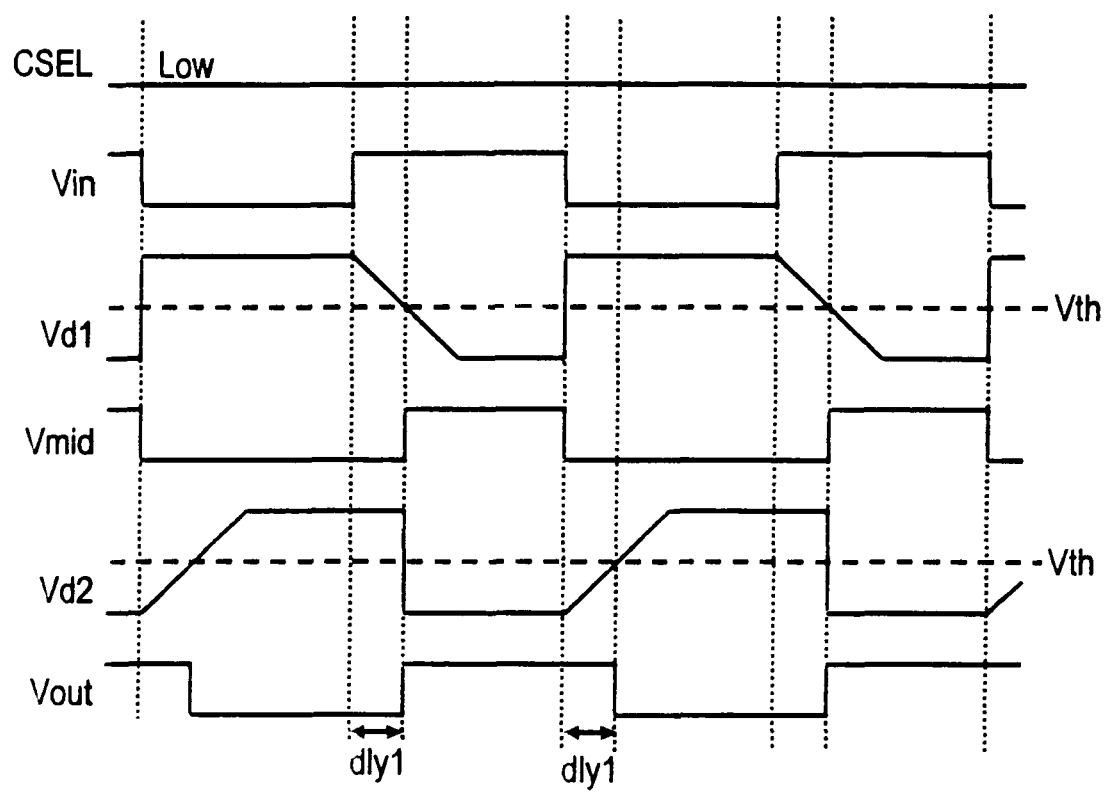
FIG. 16 is a timing chart illustrating an operation of the delay circuit shown in FIG. 14.

Next, the operation of the delay circuit 5 is described. FIG. 16 is a timing chart illustrating the operation of the delay circuit 5. In the operation described below with reference to the timing chart shown in FIG. 16, it is assumed that the capacitance switching signal CSEL is maintained in the disable state (more specifically, low-level state in the present example).

In the delay circuit 5, as shown in FIG. 16, the falling-down timing of the first intermediate output signal Vd1 is delayed by the inverter 70 and the variable-capacitance device Cv1 such that the rising edge of the second intermediate output signal Vd2 is delayed with respect to the rising edge of the input signal Vin. Furthermore, in the delay circuit 5, the rising-up timing of the third intermediate output signal Vd3 is delayed by the inverter 72 and the variable-capacitance device Cv2 such that the falling edge of the output signal Vout is delayed with respect to the falling edge of the second intermediate output signal Vd2. That is, in the delay circuit 5, it is possible to delay the output signal Vout with respect to the input signal Vin in accordance with the capacitance values of the variable-capacitance devices Cv1 and C2.

As described above, in the delay circuit 5, it is possible to control the delay time with high accuracy by using the variable-capacitance devices Cv1 and Cv2 with high accuracy according to the embodiment of the invention.

Although the present invention has been described above with reference to specific embodiments, the invention is not limited to these embodiments. Many modifications and changes are possible without departing from the spirit and the scope of the present invention.

What is claimed is:

1. A variable-capacitance device comprising:
   a first capacitance element coupled between a first power supply terminal and an output terminal;
   a capacitance selection switch configured to turn on or off in accordance with a capacitance switching signal;
   a second capacitance element coupled in parallel to the first capacitance element and in series to the capacitance selection switch; and
   an error correction circuit configured to operate such that in a state in which the capacitance selection switch is in an OFF state, in response to a charge reset signal that causes a voltage at the output terminal to be reset to a reset voltage, the error correction circuit substantially eliminates a difference between the voltage at the output terminal and a voltage at a capacitance switching node at which the second capacitance element is coupled to the capacitance selection switch,
   wherein the error correction circuit includes:
   a first switch circuit configured to apply a reset voltage to the capacitance switching node in response to the charge reset signal, wherein the reset voltage is supplied from a second power supply terminal; and
   a second switch circuit coupled in series to the first switch circuit and configured to switch the first switch circuit between an enable state and a disable state wherein the second switch circuit is controlled exclusively with respect to the capacitance selection switch in terms of their ON state.

2. The variable-capacitance device according to claim 1, wherein the second capacitance element is coupled such that a first terminal thereof is coupled to the output terminal and a second terminal thereof is coupled to the capacitance switching node, and
   wherein the capacitance selection switch is coupled such that a first terminal thereof is coupled to the capacitance switching node and a second terminal thereof is coupled to the first power supply terminal.

3. The variable-capacitance device according to claim 1 wherein the second capacitance element is coupled such that a first terminal thereof is coupled to the capacitance switching node and a second terminal thereof is coupled to the first power supply terminal, and
   wherein the capacitance selection switch is coupled such that a first terminal thereof is coupled to the output terminal and a second terminal thereof is coupled to the capacitance switching node.

4. The variable-capacitance device according to claim 1, further comprising:
   a reset circuit coupled between the output terminal and a second power supply terminal and configured to apply the reset voltage supplied from the second power supply terminal to the output terminal in response to the charge reset signal.

5. The variable-capacitance device according to claim 1, further comprising:

a current source configured to charge or discharge the first capacitance element in response to a charge/discharge control signal whose enable state is controlled exclusively with respect to the charge reset signal.

6. The variable-capacitance device according to claim 1, wherein the variable-capacitance device is used as a capacitance element in an oscillation circuit whose oscillation frequency is set by a constant current set by resistance and capacitance of the capacitance element.

7. A variable-capacitance device comprising:
- a first capacitance element coupled between a first power supply terminal and an output terminal;
- a capacitance selection switch configured to turn on or off in accordance with a capacitance switching signal;
- a second capacitance element coupled in parallel to the first capacitance element and in series to the capacitance selection switch; and
- an error correction circuit configured to operate such that in a state in which the capacitance selection switch is in an OFF state, in response to a charge reset signal that causes a voltage at the output terminal to be reset to a reset voltage, the error correction circuit substantially eliminates a difference between the voltage at the output terminal and a voltage at a capacitance switching node at which the second capacitance element is coupled to the capacitance selection switch,
- wherein the variable-capacitance device is used as a capacitance element in an oscillation circuit whose oscillation frequency is set by a constant current set by resistance and capacitance of the capacitance element, and
- wherein the oscillation circuit includes:
  - a filter capacitor configured to generate an oscillation frequency control voltage depending on the amount of a charge stored in the filter capacitor based on an oscillation frequency setting current;
  - an oscillator configured to output an oscillation signal with a frequency varying according to the oscillation frequency control voltage;
  - a control circuit configured to generate a timing control signal with a logical level that is switched based on the period of the oscillation signal;
  - a frequency detection circuit including the variable-capacitance device and configured to generate a frequency detection voltage with a voltage level varying according to the length of the period of the oscillation signal and a charging/discharging current of the variable-capacitance device based on the timing control signal; and
  - a differential amplifier configured to continuously changing the oscillation frequency setting current according to a voltage difference between the frequency detection voltage and a reference voltage and output the resultant oscillation frequency setting current to the filter capacitor.

8. The variable-capacitance device according to claim 1, wherein the variable-capacitance device is used in a time constant circuit that sets a delay time of an output signal with respect to an input signal.

* * * * *